US012805302B2

(12) United States Patent
Qin et al.

(10) Patent No.: US 12,805,302 B2
(45) Date of Patent: Nov. 17, 2026

(54) FORK SHEET TRANSISTORS WITH BACKSIDE DIELECTRIC PILLAR

(71) Applicant: International Business Machines Corporation, Armonk, NY (US)

(72) Inventors: Liqiao Qin, Albany, NY (US); Tao Li, Slingerlands, NY (US); Ruilong Xie, Niskayuna, NY (US); Julien Frougier, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 330 days.

(21) Appl. No.: 18/739,760

(22) Filed: Jun. 11, 2024

(65) Prior Publication Data

US 2025/0379146 A1 Dec. 11, 2025

(51) Int. Cl.

| | |
|---|---|
| ***H10D 84/85*** | (2025.01) |
| ***H10D 30/43*** | (2025.01) |
| ***H10D 30/67*** | (2025.01) |
| ***H10D 62/10*** | (2025.01) |
| ***H10W 20/41*** | (2026.01) |
| ***H10W 20/43*** | (2026.01) |

(52) U.S. Cl.

CPC .......... *H10W 20/435* (2026.01); *H10D 30/43* (2025.01); *H10D 30/6729* (2025.01); *H10D 30/6735* (2025.01); *H10D 30/6757* (2025.01); *H10D 62/121* (2025.01); *H10D 84/85* (2025.01); *H10W 20/43* (2026.01)

(58) Field of Classification Search

CPC .... H10W 20/435; H10W 20/43; H10D 30/43; H10D 30/6729; H10D 30/6735; H10D 30/6757; H10D 62/121; H10D 84/85

See application file for complete search history.

(56) References Cited

U.S. PATENT DOCUMENTS

| | | | | |
|---|---|---|---|---|
| 9,614,056 | B2 | 4/2017 | Xie et al. | |
| 11,289,484 | B2 | 3/2022 | Zhang et al. | |
| 11,398,480 | B2 | 7/2022 | Zhang et al. | |
| 11,817,501 | B2 | 11/2023 | Suk et al. | |
| 2021/0111115 | A1 | 4/2021 | Morrow et al. | |
| 2021/0210489 | A1 | 7/2021 | Zhang et al. | |
| 2024/0154009 | A1* | 5/2024 | Li | H10D 30/43 |
| 2025/0287642 | A1* | 9/2025 | Lin | H10D 30/014 |
| 2025/0294866 | A1* | 9/2025 | Jun | H10D 30/019 |

OTHER PUBLICATIONS

Weckx, P., et al., "Novel forksheet device architecture as ultimate logic scaling device towards 2nm", 2019 IEEE International Electron Devices Meeting (IEDM), Date of Conference: Dec. 7-11, 2019, 4 pages.

Oneriver, "What is MLCC and what are the main advantages of MLCC?", updated Feb. 14, 2022, 4 pages, https://www.onerivertronics.com/a/20011.html.

* cited by examiner

*Primary Examiner* — Zandra V Smith
*Assistant Examiner* — Corbyn D Mellinger
(74) *Attorney, Agent, or Firm* — Scully, Scott, Murphy & Presser, P.C.; Kimberly Zillig

(57) ABSTRACT

A semiconductor device is provided including a backside dielectric pillar that extends from the backside of the device into the frontside of the device where the backside dielectric pillar separates a pair of fork sheet transistors from each other.

20 Claims, 30 Drawing Sheets

FORK SHEET TRANSISTORS WITH BACKSIDE DIELECTRIC PILLAR

BACKGROUND

The present application relates to semiconductor technology, and more particularly to a semiconductor device including a backside dielectric pillar that extends from the backside of the device into the frontside of the device where the backside dielectric pillar separates a pair of fork sheet transistors from each other.

A fork sheet transistor is a type of transistor that is being currently developed for 2 nm nodes and beyond. The fork sheet transistor is an extension of a nanosheet transistor, where the nanosheets are controlled by a tri-gate forked structure, which is achieved by introducing a dielectric wall structure (i.e., dielectric pillar) between the p-type field effect transistor (i.e., PFET) and the n-type FET (i.e., NFET). This isolation allows for tighter n-to-p spacing and higher performance. In fork sheet devices, both the NFET and PFET are integrated in the same structure, unlike existing gate-all-around FETs that use different devices for the NFETs and PFETs.

SUMMARY

A semiconductor device is provided including a backside dielectric pillar that extends from the backside of the device into the frontside of the device where the backside dielectric pillar separates a pair of fork sheet transistors from each other.

In one aspect of the present application, a semiconductor device is provided that includes a pair of fork sheet transistors of a same conductivity type located on opposite sidewalls of a backside dielectric pillar, where the backside dielectric pillar entirely separates the pair of fork sheet transistors from each other. The semiconductor device further includes a backside back-end-of-the-line (BEOL) structure directly contacting a bottommost surface of the backside dielectric pillar and electrically connected to a source/drain region of a first fork sheet transistor of the pair of fork sheet transistors, and a frontside BEOL structure electrically connected to a source/drain region of a second fork sheet transistor of the pair of fork sheet transistors.

In another aspect of the present application, a semiconductor device is provided that includes a first pair of fork sheet transistors of a first conductivity type located on opposite sidewalls of a first backside dielectric pillar, where the first backside dielectric pillar entirely separates the first pair of fork sheet transistors from each other, and a second pair of fork sheet transistors of a second conductivity type opposite the first conductivity type located on opposite sidewalls of a second first backside dielectric pillar and adjacent to the first pair of transistors, where the second backside dielectric pillar entirely separates the second pair of fork sheet transistors from each other. The semiconductor device further includes a backside BEOL structure directly contacting a bottommost surface of the first backside dielectric pillar and electrically connected to a source/drain region of a first fork sheet transistor of the first pair of fork sheet transistors, and directly contacting a bottommost surface of the second backside dielectric pillar and electrically connected to a source/drain region of a third fork sheet transistor of the second pair of fork sheet transistors, and a frontside BEOL structure electrically connected to a source/drain region of a second fork sheet transistor of the first pair of fork sheet transistors and electrically connected to a source/drain region of a fourth fork sheet transistor of the second pair of transistors.

DETAILED DESCRIPTION

Figure 1:
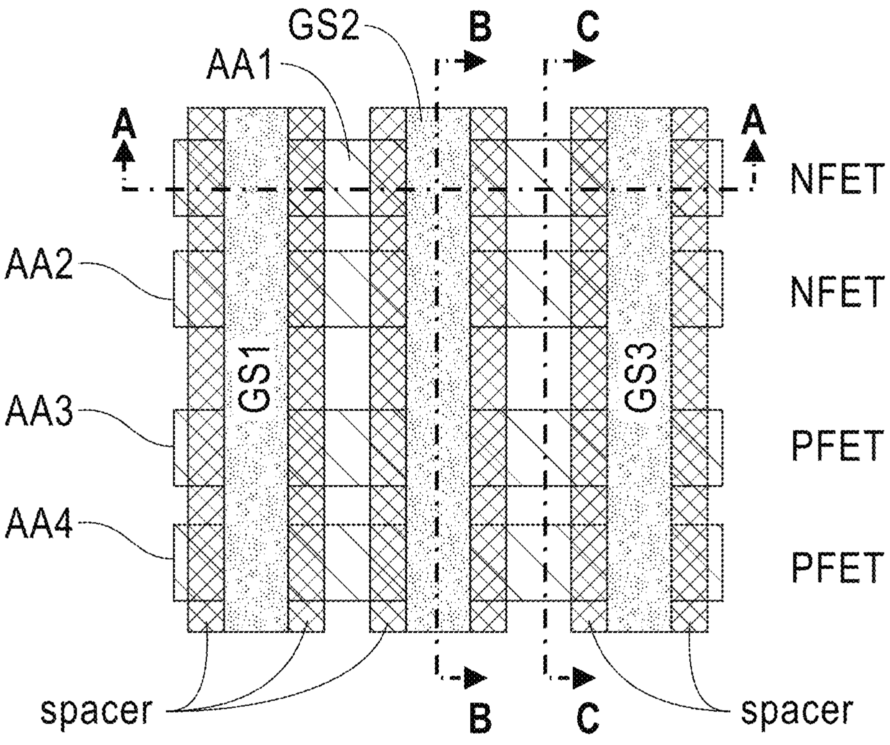
FIG. 1 is a top down view of a device layout that can be employed in accordance with an embodiment of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

The terms substantially, substantially similar, about, or any other term denoting functionally equivalent similarities refer to instances in which the difference in length, height, or orientation convey no practical difference between the definite recitation (e.g., the phrase sans the substantially similar term), and the substantially similar variations. In one embodiment, substantial (and its derivatives) denote a difference by a generally accepted engineering or manufacturing tolerance for similar devices, up to, for example, 10% deviation in value or 10° deviation in angle.

A transistor (or field effect transistor (FET)) includes a source region, a drain region, a semiconductor channel region located between the source region and the drain region, and a gate structure located above the semiconductor channel region. Collectively, the source region and the drain region can be referred to as a source/drain region. In the present application, the transistor is a fork sheet transistor. A fork sheet transistor is a non-planar transistor that includes a vertical stack of spaced apart semiconductor channel material nanosheets as the semiconductor channel region with a pair of source/drain regions located at each of the ends of the vertical stack of spaced apart semiconductor channel material nanosheets. The gate structure includes a gate dielectric and a gate electrode. The gate structure wraps around each of the spaced apart semiconductor channel material nanosheets and contacts three surfaces of each of the semiconductor channel material nanosheets. A four surface of the semiconductor channel material nanosheets is in direct physical contact with a backside dielectric pillar of the present application.

In the present application, the semiconductor device includes a frontside and a backside. The frontside includes a side of the device that includes at least one transistor, frontside contact structures, and a frontside BEOL structure. The backside of the semiconductor device is the side of the device that is opposite the frontside. The backside includes backside contact structures, and a backside BEOL structure. The backside BEOL structure can be a backside power distribution network that is capable of delivering power to the transistor through the backside of the semiconductor device. In the present application, the backside dielectric pillar is present in both the backside and the frontside of the semiconductor device. The backside dielectric pillar of the present application separates the gate structure and the source/drain regions of a pair of fork sheet transistors of a same conductivity type that are located on different sides of the backside dielectric pillar.

Referring first to FIG. 1, there is illustrated a top down view of a device layout that can be employed in accordance with an embodiment of the present application. The illustrated device layout includes four active device areas, AA1, AA2, AA3 and AA4. AA1 is a first active device area in which NFETs can be formed, AA2 is a second active device area in which other NFETs can be formed, AA3 is a third active device area in which PFETs can be formed, and AA4 is a fourth active device area in which other PFETs can be formed. In the present application, each of the FETs is a fork sheet transistor as defined above. In FIG. 1, three gate structures, GS1, GS2 and GS3 are shown by way of one example. The present application is not limited to using three gate structures. The gate structures run parallel to each other and perpendicular to each of the active device areas. A spacer is also shown along the sidewall of each gate structure. Although FIG. 1 specifically illustrates NFETs in AA1 and AA2, and PFETs in AA3 and AA4, the present application works when PFETs are formed in AA1 and AA2, and NFETS are formed in AA3 and AA4. Embodiments are also possible in which AA3 and AA4 are not present.

FIG. 1 also includes three different cuts, namely cut A-A, cut B-B, and cut C-C that will be used throughout the remaining drawings of the present application. Cut A-A is a cut that runs in a length wise direction through the middle of AA1. Cut B-B is a cut that runs in a length wise direction through a portion of the second gate structure GS2 and it passes through each of AA1, AA2, AA3 and AA4. Cut C-C is a cut that runs in a length wise direction between the second gate structure, GS2, and the third gate structure, G3 and it passes through each of AA1, AA2, AA3 and AA4. Notably, cut C-C will show the source/drain areas of the fork sheet transistors of the present application.

Figure 2A:
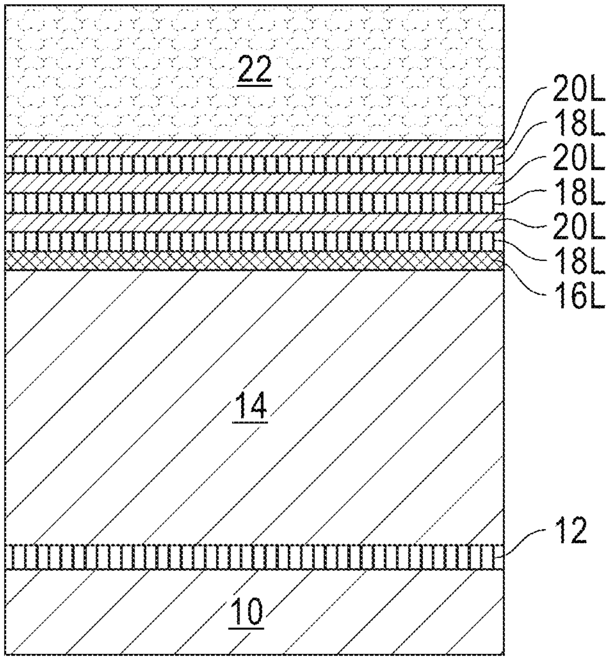
FIGS. 2A-2C are cross sectional views an exemplary structure through cuts A-A, B-B and C-C, respectively of FIG. 1 that can be used in accordance with an embodiment of the present application, the exemplary structure including a patterned hard mask located on a material stack of alternating sacrificial semiconductor material layers and semiconductor channel material layers, the material stack being located on a placeholder layer that is positioned on a substrate.
Figure 2B:
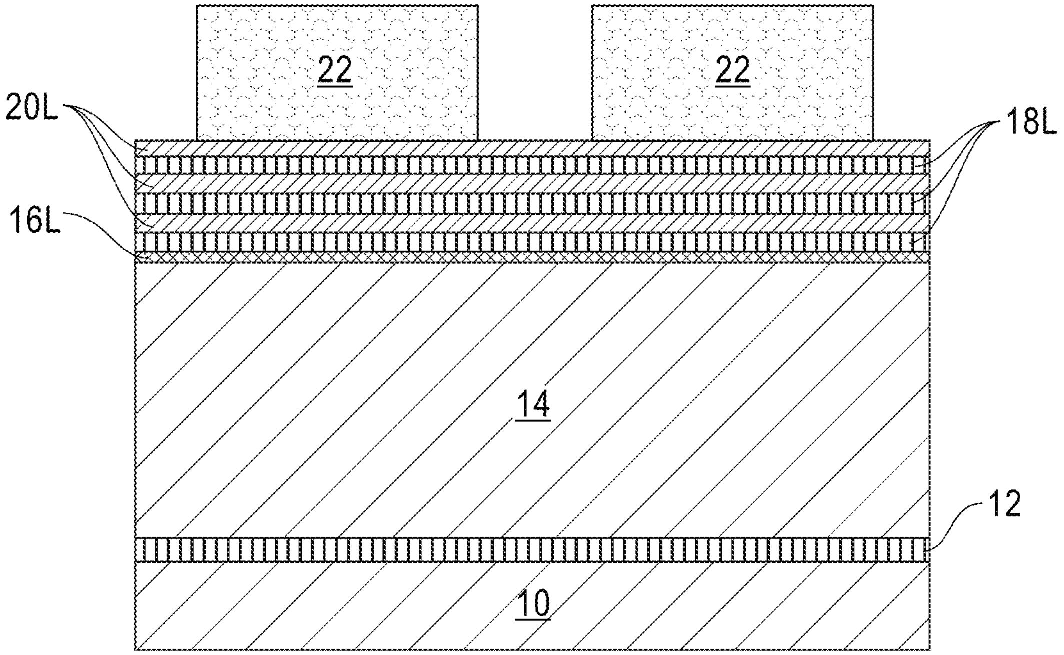
Figure 2C:
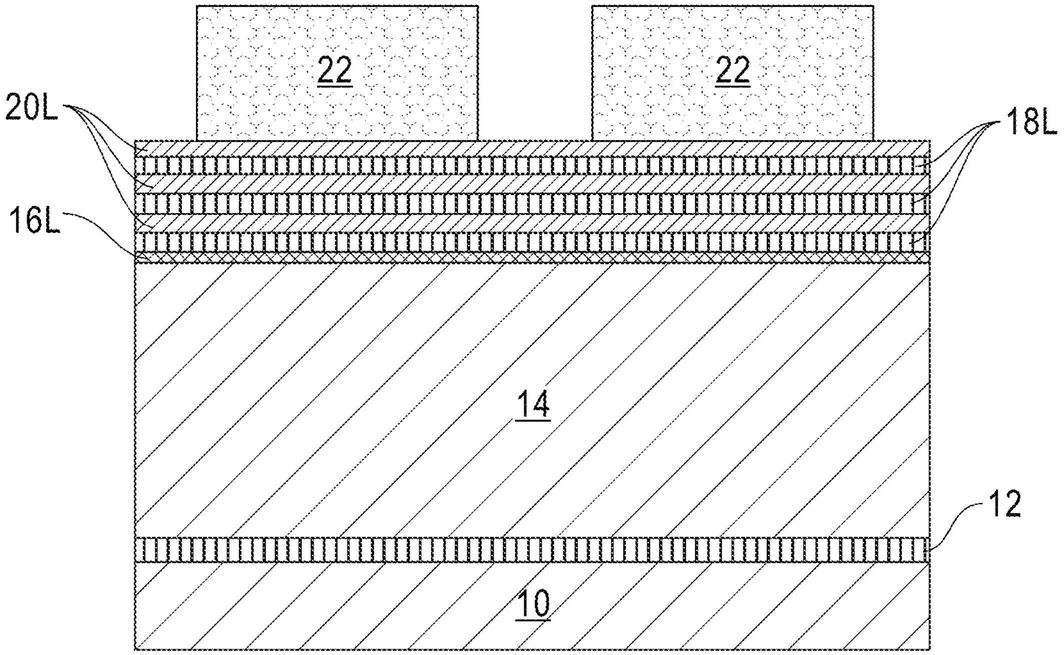

Referring now to FIGS. 2A-2C, there are illustrated an exemplary structure through cuts A-A, B-B and C-C, respectively of FIG. 1 that can be used in accordance with an embodiment of the present application. The exemplary structure illustrated in FIGS. 2A-2C includes a patterned hard mask 22 located on a material stack of alternating sacrificial semiconductor material layers 18 and semiconductor channel material layers 20, the material stack being located on a placeholder layer 16L that is positioned on a substrate.

The substrate includes at least a semiconductor device layer 14. In addition to the semiconductor device layer 14, the substrate can also include a semiconductor base layer 10 and/or an etch stop layer 12. Embodiments are contemplated in which the semiconductor base layer 10 and/or the etch stop layer 12 are omitted and the substrate includes only the semiconductor device layer 14. The semiconductor base layer 10 is composed of a first semiconductor material, and the semiconductor device layer 14 is composed of a second semiconductor material. As used throughout the present application, the term "semiconductor material" denotes a material that has semiconducting properties. Examples of semiconductor materials that can be used in the present application include, but are not limited to, silicon (Si), a silicon germanium (SiGe) alloy, a silicon germanium carbide (SiGeC) alloy, germanium (Ge), III/V compound semiconductors or II/VI compound semiconductors. The second semiconductor material that provides the semiconductor device layer 14 can be compositionally the same as, or compositionally different from, the first semiconductor material that provides the semiconductor base layer 10. In some embodiments of the present application, the etch stop layer 12 can be composed of a dielectric material such as, for example, silicon dioxide and/or boron nitride. In other embodiments of the present application, the etch stop layer 12 is composed of a third semiconductor material that is compositionally different from the first semiconductor material that provides the semiconductor base layer 10 and the second semiconductor material that provides the semiconductor device layer 14. In one example, the semiconductor base layer 10 is composed of silicon, the etch stop layer 12 is composed of silicon dioxide, and the semiconductor device layer 14 is composed of silicon. In another example, the semiconductor base layer 10 is composed of silicon, the etch stop layer 12 is composed of silicon germanium, and the semiconductor device layer 14 is composed of silicon.

The placeholder layer 16L is composed of a fourth semiconductor material. The fourth semiconductor material that provides the placeholder layer 16L is compositionally different from the second semiconductor material that provides the semiconductor device layer 14. The fourth semiconductor material that provides the placeholder layer 16L is also designed to be compositionally different from the semiconductor materials that provide the sacrificial semiconductor material layers 18L and the semiconductor channel material layers 20L of the material stack. The placeholder layer 16L can be formed by a deposition process such as, for example, chemical vapor deposition (CVD), plasma enhanced chemical vapor deposition (PECVD) or epitaxial growth. The terms "epitaxial growth" or "epitaxially growing" means the growth of a semiconductor material on a growth surface of another semiconductor material, in which the semiconductor material being grown has the same crystalline characteristics as the growth surface of the another semiconductor material. In an epitaxial deposition process, the chemical reactants provided by the source gases are controlled and the system parameters are set so that the depositing atoms arrive at the growth surface of the another semiconductor material with sufficient energy to move around on the growth surface and orient themselves to the crystal arrangement of the atoms of the growth surface. Examples of various epitaxial growth process apparatuses that can be employed in the present application include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition typically ranges from 450° C. to 900° C. Although higher temperature typically results in faster deposition, the faster deposition may result in crystal defects and film cracking.

Each sacrificial semiconductor material layer 18L is composed of a fifth semiconductor material, while each semiconductor channel material layer 20L is composed of a sixth semiconductor material. In the present application, the sixth semiconductor material is compositionally different from both the fourth semiconductor material and the fifth semiconductor material, and the fifth semiconductor material is different from the fourth semiconductor material. In some embodiments, the sixth semiconductor material that provides each semiconductor channel material layer 20L provides high channel mobility for NFET devices. In other embodiments, the sixth semiconductor material that provides each semiconductor channel material layer 20L provides high channel mobility for PFET devices. In one example, each semiconductor channel material layer 20L is composed of silicon, each sacrificial semiconductor material layer 18L is composed of a SiGe alloy having a first Ge content, and the placeholder layer 16L is composed of a SiGe alloy having a second Ge content that differs from the first Ge content. The material stack of alternating sacrificial semiconductor material layers 18L and semiconductor channel material layers 20L can be formed utilizing one or more deposition processes including, for example, CVD, PECVD and epitaxial growth as defined above. In the present application, the material stack typically includes "n" number of sacrificial semiconductor material layers 18L and "n" number of semiconductor channel material layers 20L in which n is at least 2.

The patterned hard mask 22 is composed of a dielectric hard mask material such as, for example, silicon dioxide, silicon nitride and/or silicon oxynitride. The patterned hard mask 22 can be formed by deposition (e.g., CVD or PECVD), followed by lithographic patterning. Lithographic patterning includes forming a photoresist material on a layer/multilayered stack that needs to be patterned, exposing the as deposited photoresist material to a desired pattern of irradiation, developing the photoresist material and transferring the patterned from the developed photoresist material into the layer/multilayered stack that needs to be patterned, the transferring of the pattern can include one or more etching processes. The one or more etching processes can include dry etching and/or wet etching. Dry etching can include reactive ion etching (RIE), plasma etching or ion beam etching. Wet etching can include the use of a chemical etchant that is selective in removing physically exposed portions of the layer/multilayered stack that needs to be patterned. The photoresist material is removed after the pattern transfer process utilizing a material removal process that is selective in removing the photoresist material. In the present application, the patterned hard mask 22 includes openings in which a portion of the underlying material stack is physically exposed; the patterned hard mask 22 is used in defining active device areas.

Figure 3A:
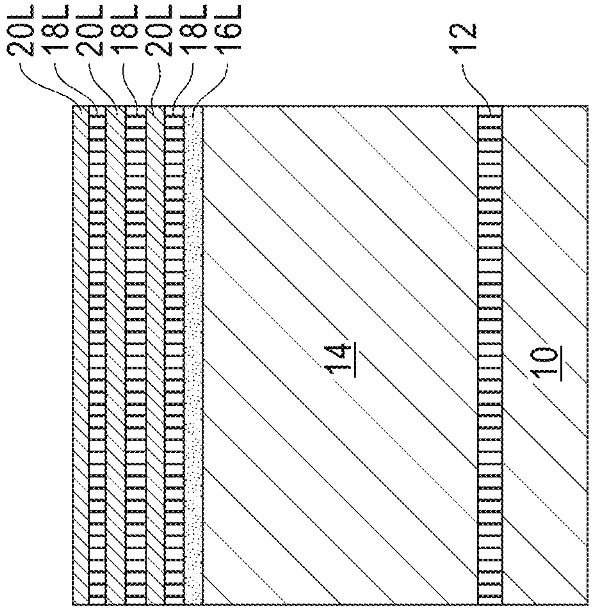
FIGS. 3A-3C are cross sectional views of the exemplary structure of FIGS. 2A-2C, respectively, after etching the material stack and the placeholder layer utilizing the patterned hard mask as an etch mask to define active device areas including a patterned material stack located on a now patterned placeholder layer, forming a shallow trench isolation structure adjacent to each active device area, and removing the patterned hard mask.
Figure 3B:
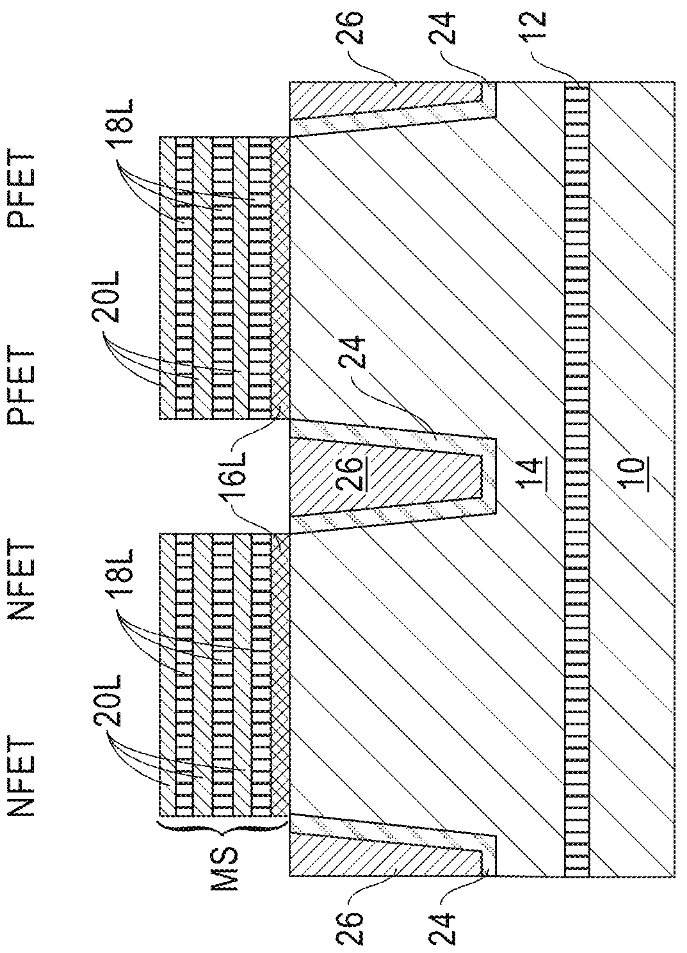
Figure 3C:
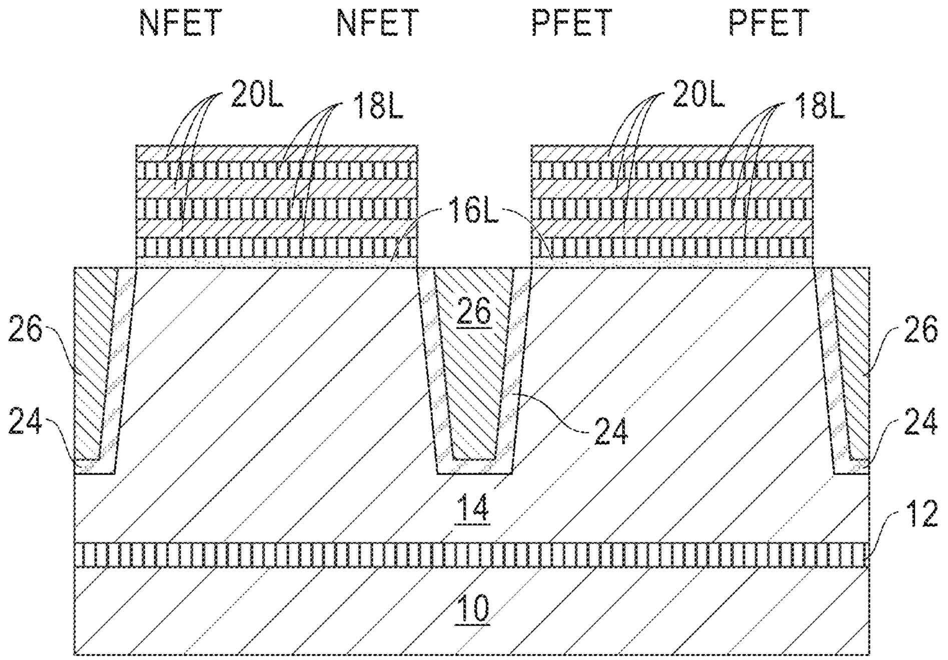

Referring now to FIGS. 3A-3C, there are illustrated the exemplary structure of FIGS. 2A-2C, respectively, after etching the material stack and the placeholder layer 16L utilizing the patterned hard mask 22 as an etch mask to define active device areas including a patterned material stack located on placeholder layer 16L that has been previously patterned, forming a shallow trench isolation structure adjacent to each active device area, and removing the patterned hard mask 22. The etching of the material stack and the placeholder layer 16L can be performed utilizing one or more etching processes. For example, a single etch can be used, or multiple etching processes can be used. The etch removes portions of the material stack and the placeholder layer 16L that are not protected by the patterned hard mask 22. After etching, a portion of the material stack and the placeholder layer 16L remain beneath the patterned hard mask 22. The remaining portion of the material stack is referred to herein as the patterned material stack which includes non-etched portions of the sacrificial semiconductor material layers 18L and the semiconductor channel material layers 20L that make up the original material stack. The remaining portion of the placeholder layer 16L is referred to herein as the patterned placeholder layer.

The shallow trench isolation structure is formed after forming the active device areas by etching a trench into an upper portion of the semiconductor device layer 14, and then forming a trench dielectric liner 24 and a trench dielectric material 26 in the trench. In some embodiments, the trench dielectric liner 24 is not present. The trench dielectric liner 24 is composed of any trench dielectric liner material, while the trench dielectric material 26 is composed of any trench dielectric material. In one example, the trench dielectric liner 24 is composed of silicon nitride, and the trench dielectric material 26 is composed of silicon dioxide. The forming of the dielectric liner 24 and the trench dielectric material 26 in the trench includes first depositing a layer of the trench dielectric liner material, second depositing a trench dielectric material on the layer of trench dielectric liner material, and then performing an etch back process. The shallow trench isolation structure can have a topmost surface that is substantially coplanar with a topmost surface of the semiconductor device layer 14.

The patterned hard mask 22 can be removed between the formation of the active device areas and the shallow trench isolation structure, or after formation of the shallow trench isolation structure. The patterned hard mask 22 can be removed utilizing a material removal process such as, for example, etching or planarization.

It is noted that FIGS. 3B and 3C include the terms "PFET" and "NFET". The terms are including in FIGS. 3B and 3C to illustrate the location in which such transistors will be formed. Notably, each patterned material stack that is formed will be used to define a pair of transistors having a same conductivity type. While two active device areas are shown, it is possible to form a single active device region in which a pair of transistors having a same conductivity type will be formed, or more than two active device areas can be formed.

Figure 4B:
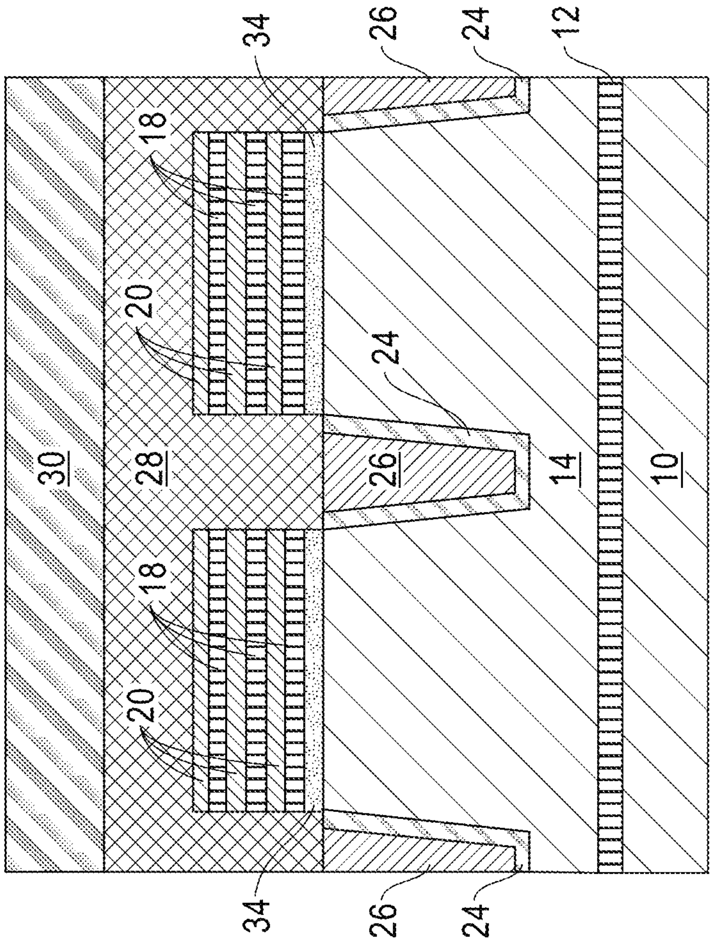
FIGS. 4A-4C are cross sectional views of the exemplary structure of FIGS. 3A-3C, respectively, after sacrificial gate structure, gate spacer and bottom dielectric isolation layer formation.
Figure 4A:
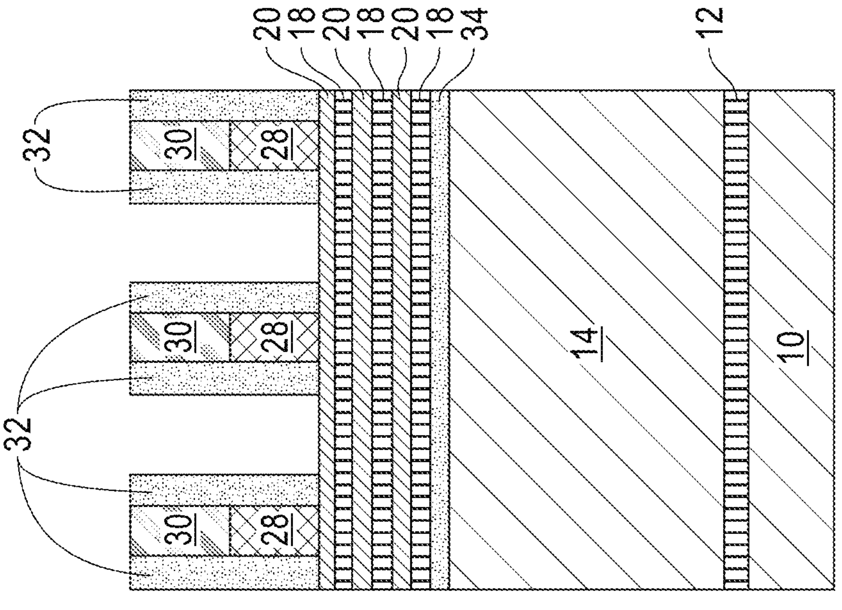
Figure 4C:
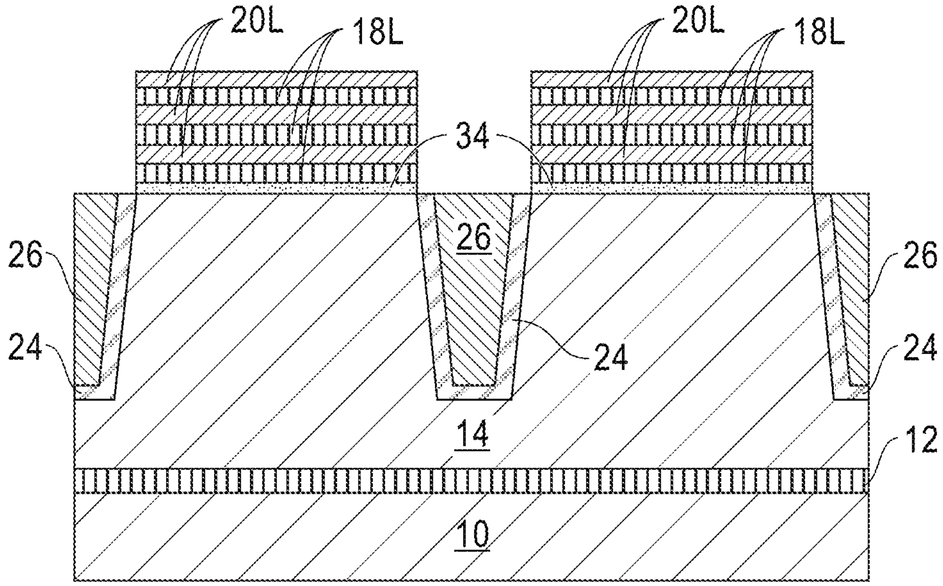

Referring now to FIGS. 4A-4C, there are illustrated the exemplary structure of FIGS. 3A-3C, respectively, after sacrificial gate structure 28, gate spacer 32 and bottom dielectric isolation layer 34 formation. In some embodiments, a sacrificial gate cap 30 can be present on top of the sacrificial gate structure 28. In other embodiments, the sacrificial gate cap 30 can be omitted. The sacrificial gate structure 28, which straddles each patterned material stack, is composed of at least a sacrificial gate material. The sacrificial gate structure 28 can also include an optional sacrificial gate dielectric material (not shown in the drawings) located beneath the sacrificial gate material. When present, the sacrificial gate dielectric material is composed of a dielectric material such as, for example, silicon dioxide. The sacrificial gate material can include, but is not limited to, polysilicon, amorphous silicon, amorphous silicon germanium, tungsten (W), titanium (Ti), tantalum (Ta), nickel (Ni), ruthenium (Ru), palladium (Pd) platinum (Pt) or alloys of such metals. When present, the sacrificial gate cap 30 is composed of a hard mask material such as, for example, silicon dioxide, silicon nitride and/or silicon oxynitride. The sacrificial gate structure 28 and the sacrificial gate cap 30 can be formed by first depositing a blanket layer of at least the sacrificial gate material, followed by second depositing a blanket layer of hard mask material; the second depositing step is optional and need not be performed in all embodiments. The blanket layers are then patterned by lithography and etching to provide the sacrificial gate structure 28 and sacrificial gate cap 30.

After forming the sacrificial gate structure 28 and if present, the sacrificial gate cap 30, the gate spacer 32 and the bottom dielectric isolation layer 34 are formed simultaneously. Notably, the gate spacer 32 and the bottom dielectric isolation layer 34 are formed by first performing an etch that is selective in removing the patterned placeholder layer 16L from beneath each patterned material stack; a gap is formed beneath each patterned material stack. The patterned material stack is anchored in place by at least the sacrificial gate structure 28. A dielectric spacer material is then deposited filling the gap and continuing along a sidewall of the sacrificial gate structure 28 and if, present, a sidewall of the sacrificial gate cap 30. A spacer etch is then performed forming the gate spacer 32 along the sidewall of the sacrificial gate structure 28 and if, present, the sidewall of the sacrificial gate cap 30, and the bottom dielectric isolation layer 34 is formed in the gap that is located beneath each patterned material stack. The dielectric spacer material can include, silicon dioxide, SiN, SiBCN, SiOCN or SiOC.

Figure 5B:
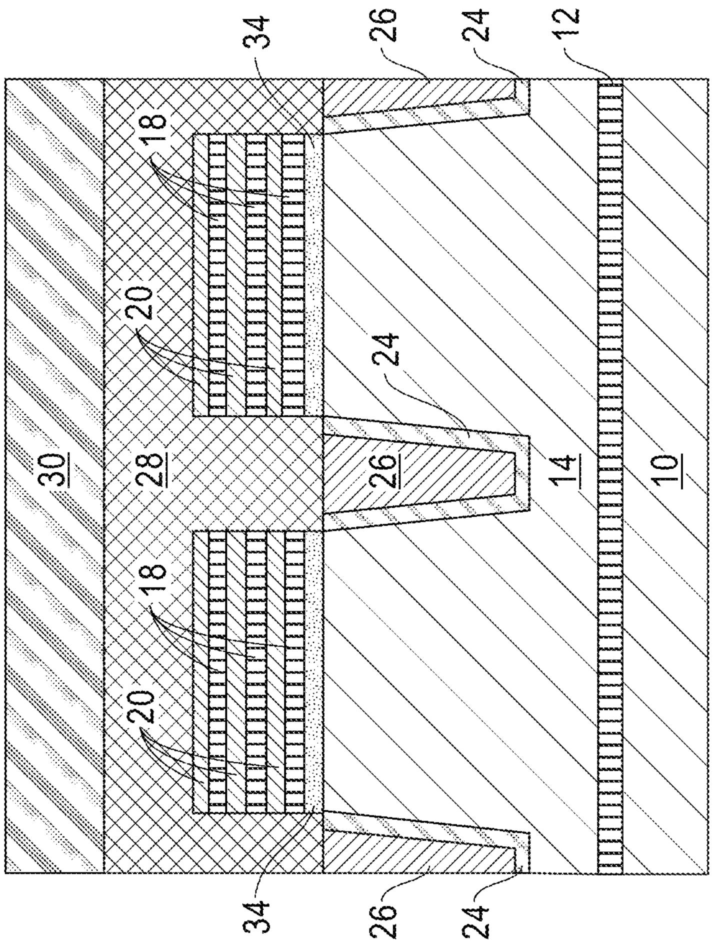
FIGS. 5A-5C are cross sectional views of the exemplary structure of FIGS. 4A-4C, respectively, after etching the patterned material stack utilizing the sacrificial gate structure and the gate spacer as a combined etch mask to provide a nanosheet stack, recessing each sacrificial semiconductor material nanosheet of the nanosheet stack, and forming inner spacers.
Figure 5A:
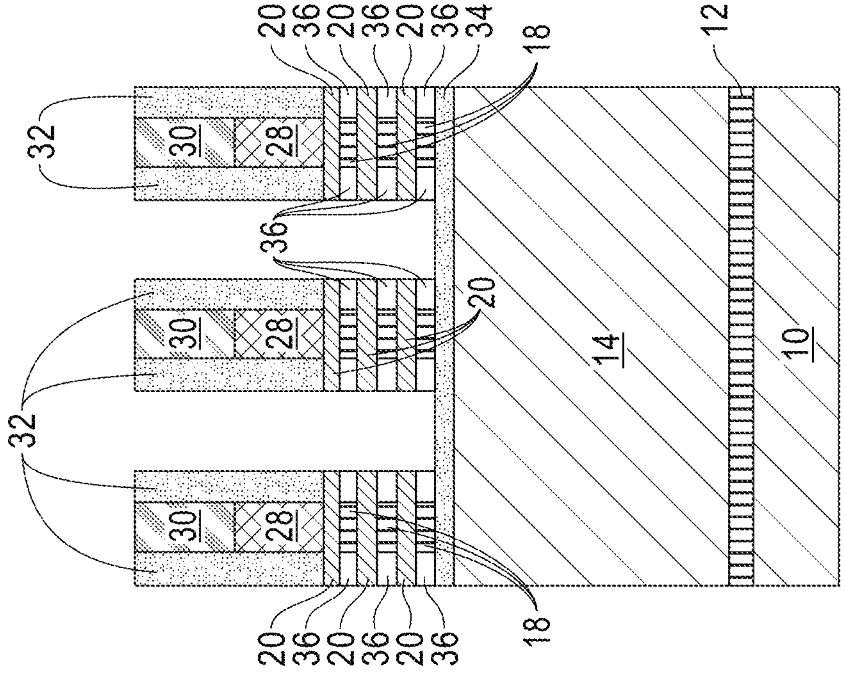
Figure 5C:
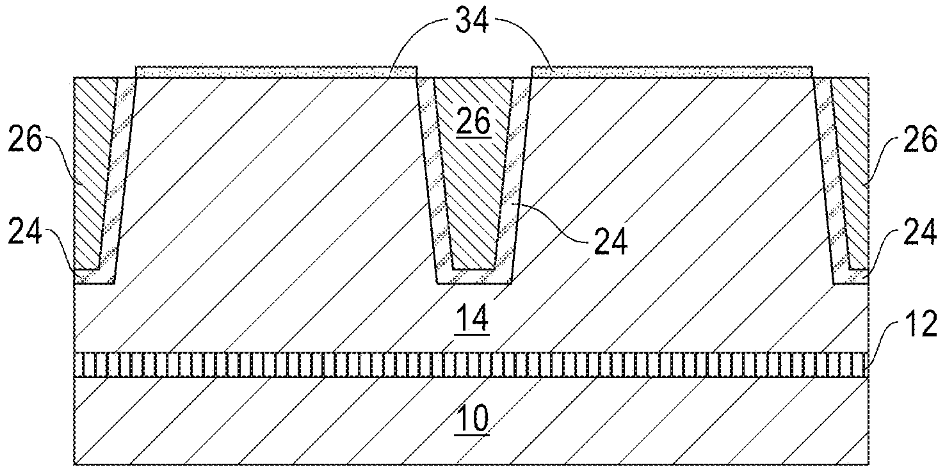

Referring now to FIGS. 5A-5C, there are illustrated the exemplary structure of FIGS. 4A-4C, respectively, after etching the patterned material stack utilizing the sacrificial gate structure 28 and the gate spacer 32 as a combined etch mask to provide a nanosheet stack, recessing each sacrificial semiconductor material nanosheet 18 of the nanosheet stack, and forming inner spacers 36. The etching of the patterned material stack includes one or more etching processes that stop on the bottom dielectric isolation layer 34. In one example, the etching of the patterned material stack includes RIE. Note that the patterned material sack is completely removed from the source/drain area that is illustrated in FIG. 5C. The nanosheet stack includes alternating sacrificial semiconductor material nanosheets 18 and semiconductor channel material nanosheets 20. The sacrificial semiconductor material nanosheets 18 are non-etched portions of the patterned sacrificial semiconductor material layers 18L in the patterned material stack, while the semiconductor channel material nanosheets 20 are non-etched portions of the patterned semiconductor channel material layers 20L in the patterned material stack.

After forming the nanosheet stack, each sacrificial semiconductor material nanosheet 18 of the nanosheet stack is recessed utilizing a lateral etching process. A gap is formed next to each recessed sacrificial semiconductor material nanosheet 18. Inner spacer 36 is formed in each gap by depositing a spacer dielectric material as described above, and then performing an inner spacer formation etch.

Figure 6A:
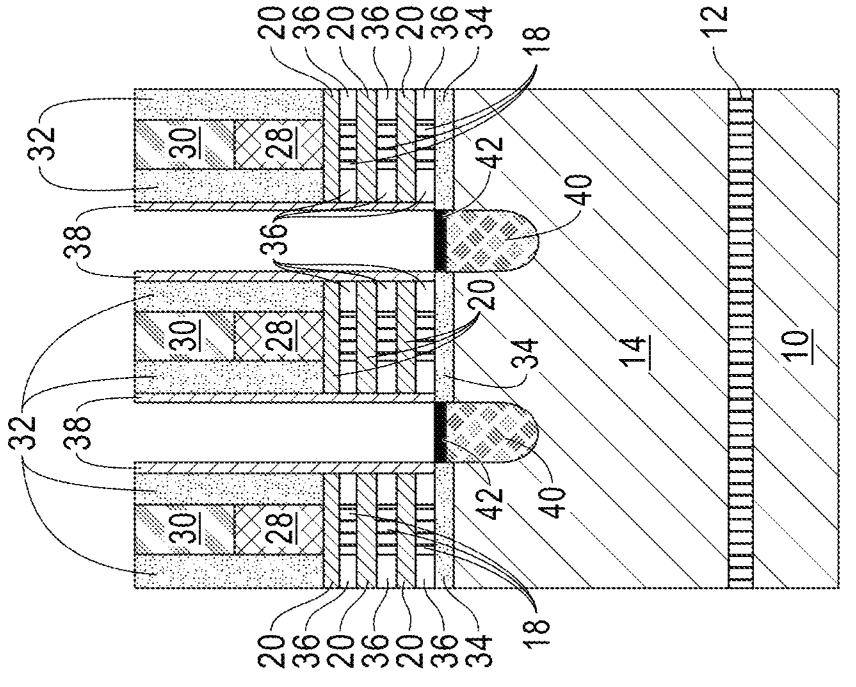
FIGS. 6A-6C are cross sectional views of the exemplary structure of FIGS. 5A-5C, respectively, after forming backside source/drain contact placeholder structures in an upper portion of the substrate.
Figure 6B:
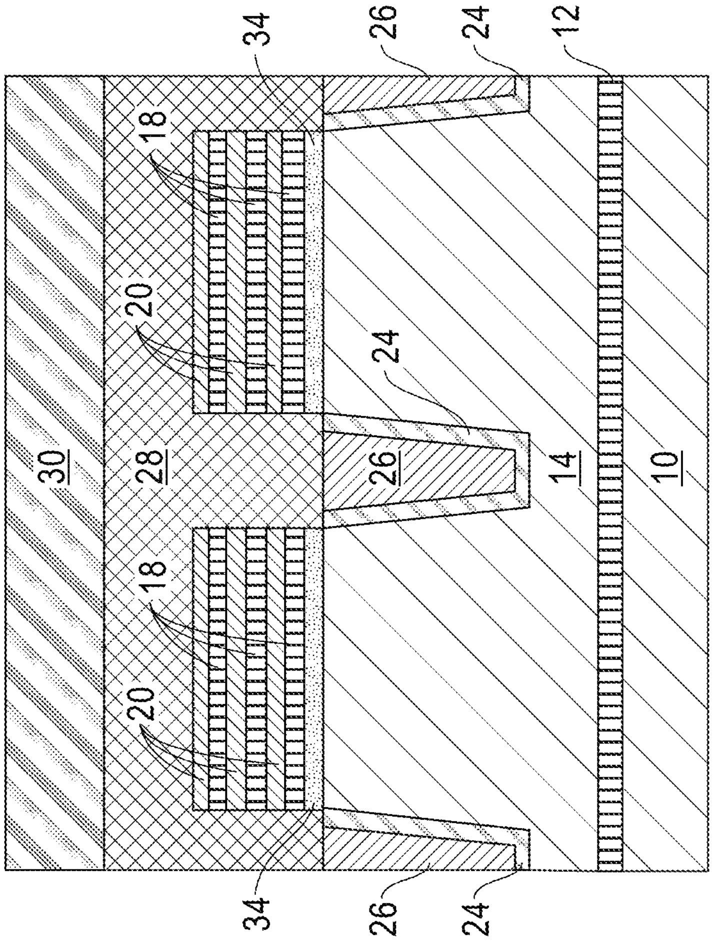
Figure 6C:
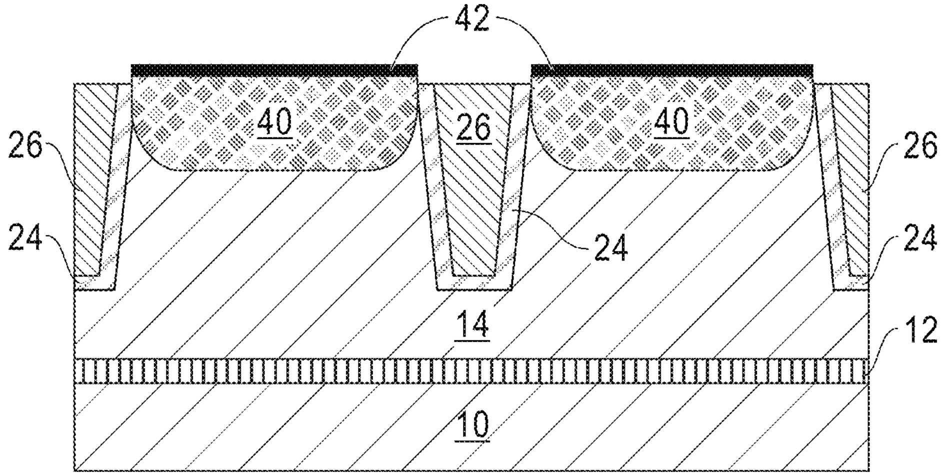

Referring now to FIGS. 6A-6C, there are illustrated the exemplary structure of FIGS. 5A-5C, respectively, after forming backside source/drain contact placeholder structures 40 in an upper portion of the substrate; notably the backside source/drain contact placeholder structures 40 are formed in an upper portion of the semiconductor device layer 14. The formation of the backside source/drain contact placeholder structures 40 includes forming a sacrificial liner 38 along a sidewall of each of following: the gate spacer 32, each semiconductor channel material nanosheet 20 and each inner spacer 36. The sacrificial liner 38 can be composed of a dielectric material such as, for example, aluminum oxide or titanium oxide. The sacrificial liner 38 can be formed by deposition, followed by a directional etch the removes sacrificial liner 38 from all horizontal surfaces of the exemplary structure. With the sacrificial liner 38 in place, a punch through etch is performed to remove physically exposed portions of the bottom dielectric isolation layer 34. Note that within the cross sectional view showing the source/drain regions of the various transistors (i.e., FIG. 6C) the bottom dielectric isolation layer 34 is removed from on top of the semiconductor device layer 14 by the punch through etch. Trenches are then formed in the semiconductor device layer 14 by etching. Backside source/drain contact placeholder structures 40 are then formed in the trenches by deposition (e.g., CVD, PECVD or epitaxial growth) of a seventh semiconductor material, and then performing an etch back process. Each backside source/drain contact placeholder structure 40 is composed of a remaining portion of the as-deposited seventh semiconductor material. The seventh semiconductor material that provides each backside source/drain contact placeholder structure 40 is compositionally different from at least the second semiconductor material that provides the semiconductor device layer 14. Each backside source/drain contact placeholder structure 40 has a topmost surface that is substantially coplanar with a topmost surface of the semiconductor device layer 14. The sacrificial liner 38 is removed any time after defining the trenches that house the backside source/drain contact structures 40.

In some embodiments and as is illustrated in FIGS. 6A-6C, a semiconductor buffer layer 42 can be formed on top of each backside source/drain contact placeholder structure 40. In other embodiments, no semiconductor buffer layer 42 is formed. The semiconductor buffer layer 42 is composed of an eighth semiconductor material. The eighth semiconductor material is compositionally different from the seventh semiconductor material that provides the backside source/drain contact placeholder structures 40. The semiconductor buffer layer 42 is typically used to facilitate the formation of the source/drain regions. The semiconductor buffer layer 42 is generally located above the topmost surface of the substrate (e.g., the topmost surface of the semiconductor device layer 14), but not above a bottommost surface of the bottommost semiconductor channel material nanosheet of the nanosheet stack. The semiconductor buffer layer 42 can be formed by a deposition process such as, for example, CVD, PECVD or epitaxial growth. An etch back process can follow the deposition used in providing the semiconductor buffer layer 42.

Figure 7B:
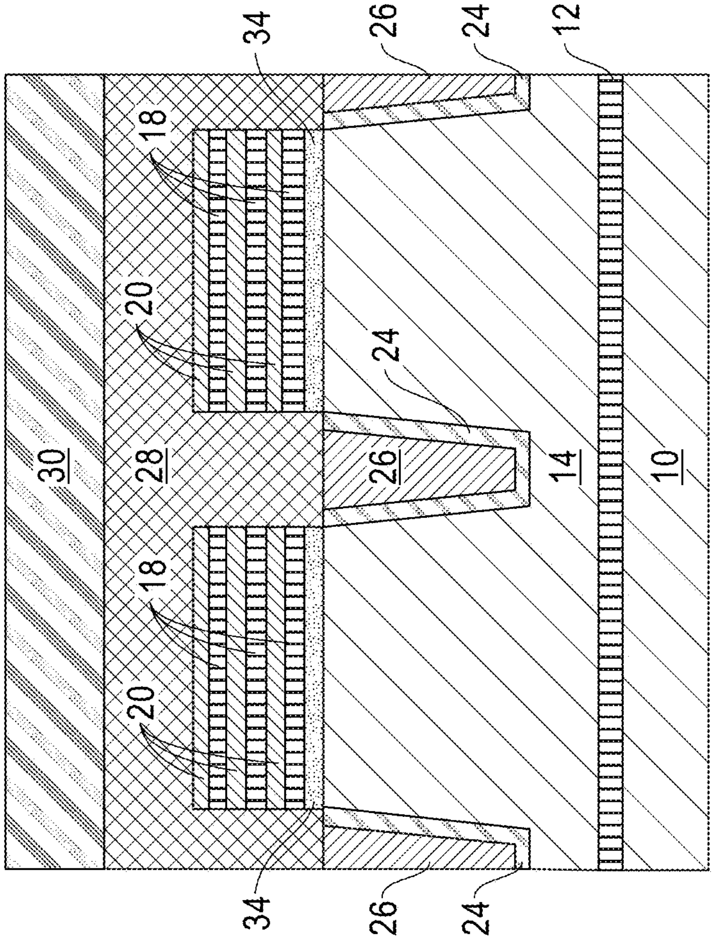
FIGS. 7A-7C are cross sectional views of the exemplary structure of FIGS. 6A-6C, respectively, after forming a source/drain region on top of each backside source/drain contact placeholder structure.
Figure 7A:
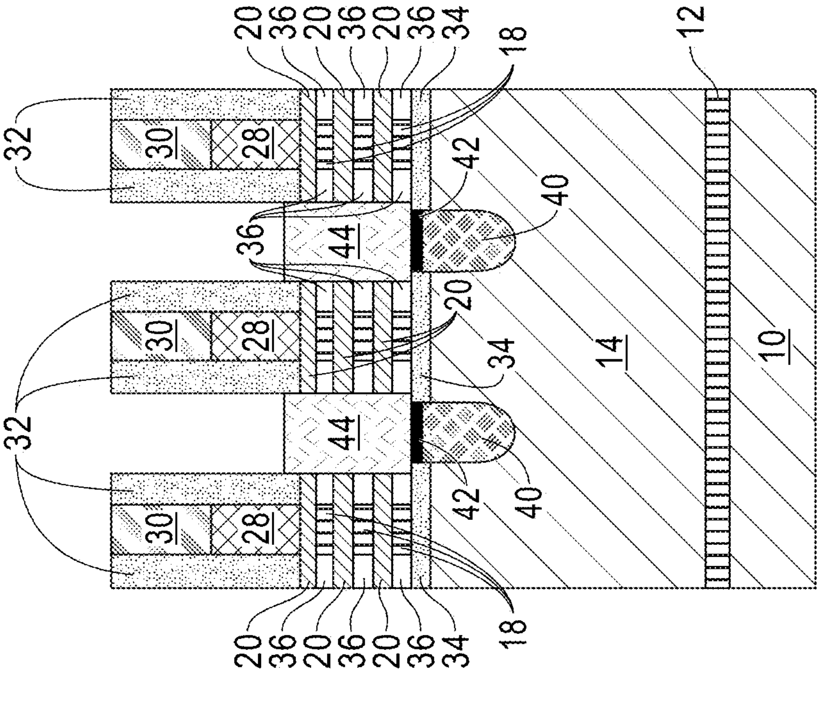
Figure 7C:
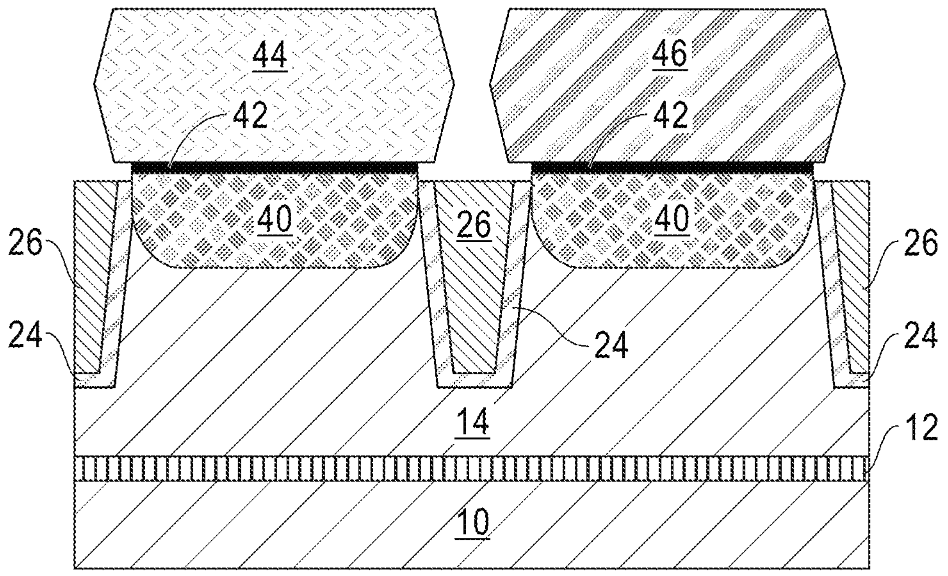

Referring now to FIGS. 7A-7C, there are illustrated the exemplary structure of FIGS. 6A-6C, respectively, after forming a source/drain region on top of each backside source/drain contact placeholder structure 40. In some embodiments, the source/drain regions include first device source/drain regions 44 and second device source/drain regions 46. In the present application, the first device source/drain regions 44 are for a first conductivity type transistor, while the second device source/drain regions 46 are for a second conductivity type transistor that is of a different conductivity than the first conductivity type transistor. In one example, the first device source/drain regions 44 are for NFETs, while the second device source/drain regions 46 are for PFETS.

Each source/drain region (e.g., the first device source/drain regions 44 and the second device source/drain regions 46) is composed of a semiconductor material and a dopant. The dopant can be either a p-type dopant or an n-type dopant. The term "p-type" refers to the addition of impurities to an intrinsic semiconductor that creates deficiencies of valence electrons. In a silicon-containing semiconductor material, examples of p-type dopants, i.e., impurities, include, but are not limited to, boron, aluminum, gallium, phosphorus and indium. "N-type" refers to the addition of impurities that contributes free electrons to an intrinsic semiconductor. In a silicon containing semiconductor material, examples of n-type dopants, i.e., impurities, include, but are not limited to, antimony, arsenic and phosphorous. In one example, each source/drain region (e.g., the first device source/drain regions 44 and the second device source/drain regions 46) can have a dopant concentration of from $4\times10^{20}$ atoms/$cm^3$ to $3\times10^{21}$ atoms/$cm^3$. The source/drain regions (e.g., the first device source/drain regions 44 and the second device source/drain regions 46) can be formed by a deposition process such as, for example, CVD, PECVD or epitaxial growth. An etch back process can follow the deposition used in providing the source/drain regions (e.g., the first device source/drain regions 44 and the second device source/drain regions 46).

In the specific embodiment illustrated, each first device source/drain region 44 is composed of a ninth semiconductor material and a first dopant, and each second device source/drain region 46 is composed of a tenth semiconductor material and a second dopant in which the second dopant is of an opposite conductivity type than the first dopant. In the illustrated embodiment, the ninth semiconductor can be compositionally the same as, or compositionally different from, the tenth semiconductor material.

Each source/drain region (e.g., the first device source/drain regions 44 and the second device source/drain regions 46) is formed directly on either the semiconductor buffer layer 42 or the backside source/drain contact placeholder structure 40. Each source/drain region (e.g., the first device source/drain regions 44 and the second device source/drain regions 46) has a height that is typically greater than a height of the nanosheet stack. Each source/drain region (e.g., the first device source/drain regions 44 and the second device source/drain regions 46) extends outward from a physically exposed sidewall of each semiconductor channel material nanosheet 20.

Figure 8B:
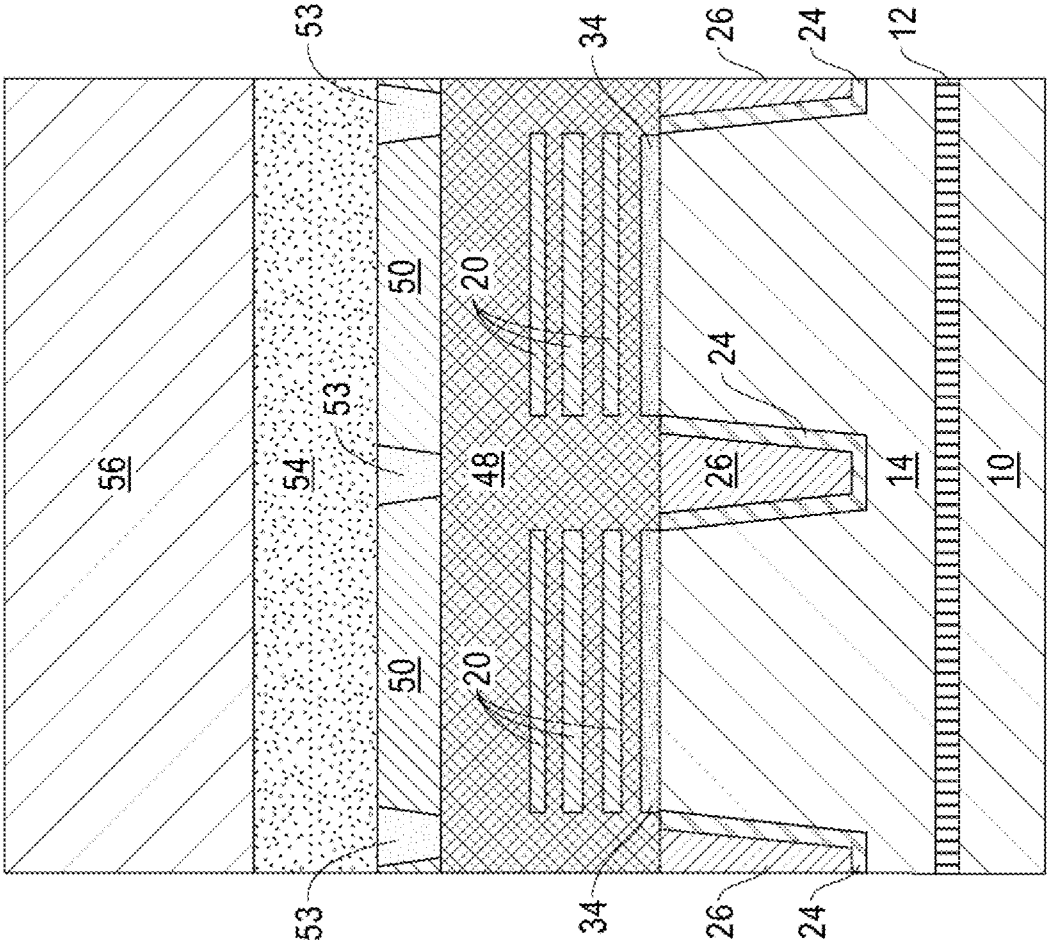
FIGS. 8A-8C are cross sectional views of the exemplary structure of FIGS. 7A-7C, respectively, after removing the sacrificial gate structure to reveal the nanosheet stack, removing each sacrificial semiconductor material nanosheet of the revealed nanosheet stack, forming a gate structure on each of the semiconductor channel material nanosheets of the nanosheet stack, forming a middle-of-the-line (MOL) level, a frontside back-end-of-the-line (BEOL) structure and a carrier wafer.
Figure 8A:
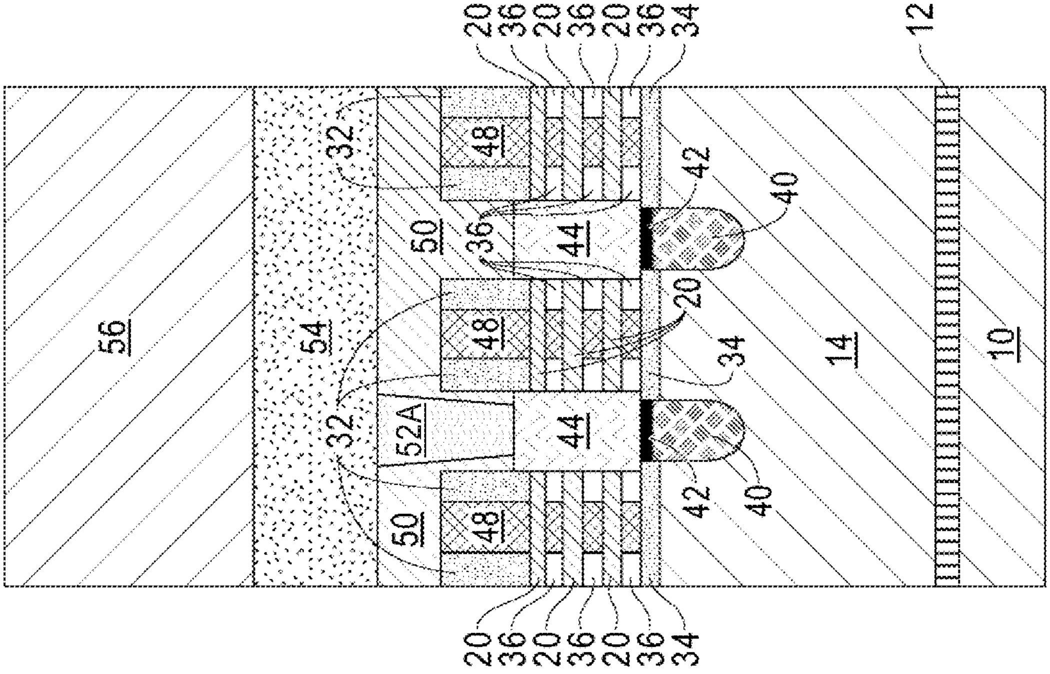
Figure 8C:
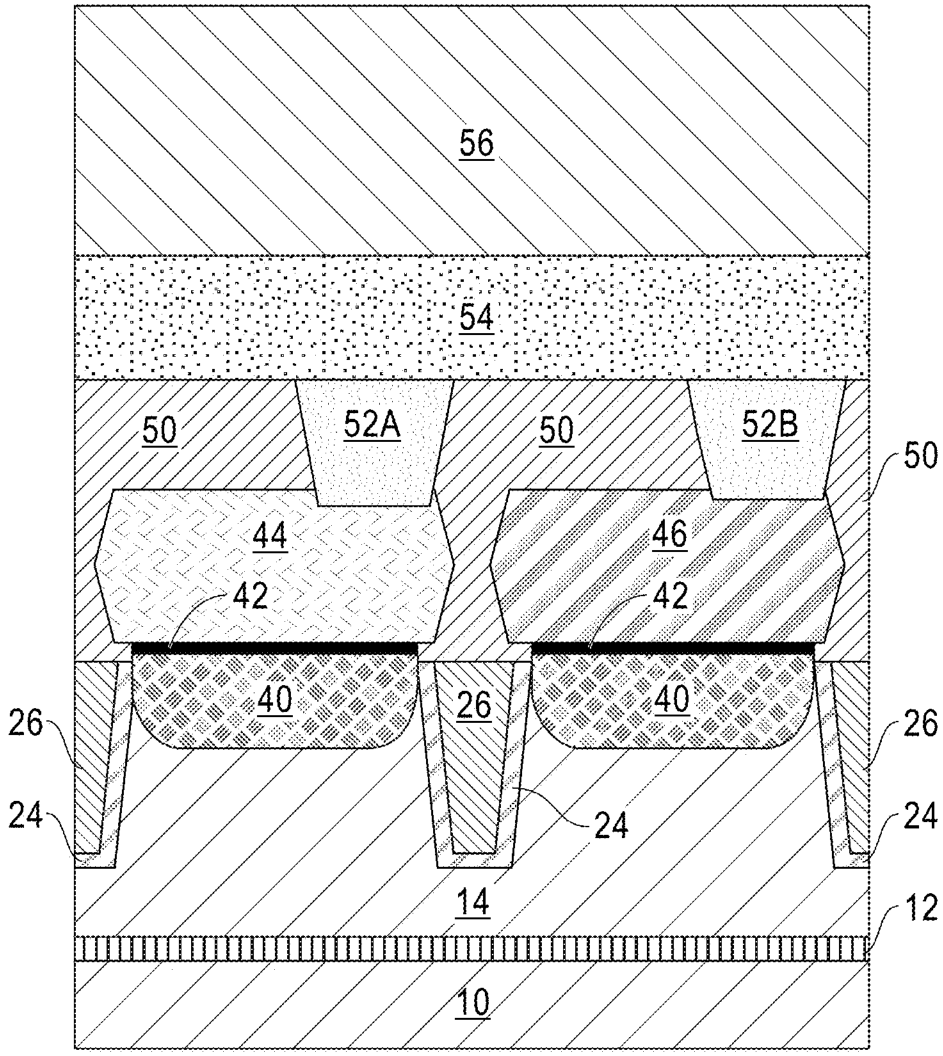

Referring now to FIGS. 8A-8C, there are illustrated the exemplary structure of FIGS. 7A-7C, respectively, after removing the sacrificial gate structure 28 to reveal the nanosheet stack, removing each sacrificial semiconductor material nanosheet 18 of the revealed nanosheet stack, forming a gate structure 48 on each of the semiconductor channel material nanosheets 20 of the nanosheet stack, forming a MOL level, a frontside BEOL structure 54 and a carrier wafer 56.

In the present application, after forming the source/drain regions and prior to removing the sacrificial gate structure 28, a first frontside interlayer dielectric (ILD) layer (not shown) in formed. In the present application, the first frontside ILD layer represents a bottom portion of a multilayered MOL dielectric region 50 that is shown in FIGS.

8A-8C. The first frontside ILD layer is composed of ILD material including, for example, silicon oxide, silicon nitride, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than 4.0. All dielectric constants mentioned herein are relative to a vacuum unless otherwise noted. The first frontside ILD layer can be formed by a deposition process (e.g., CVD, PECVD or spin-on coating), followed by a planarization process. Throughout the present application, a planarization process can include grinding and/or chemical mechanical planarization (CMP). It is noted that during the planarization process the sacrificial gate cap 30 and an upper portion of each gate spacer 32 can be removed. The first frontside ILD layer typically has a topmost surface that is substantially coplanar with a topmost surface of the sacrificial gate structure 28.

Next, the sacrificial gate structure 28 is removed utilizing a material removal process such as, for example, RIE, that is selective in removing the sacrificial gate structure 28. The removal of the sacrificial gate structure 28 reveals each nanosheet stack. Each sacrificial semiconductor material nanosheet 18 of each revealed nanosheet stack is then removed utilizing a material removal process such as, for example, another RIE, that is selective in removing each sacrificial semiconductor material nanosheet 18. The removal of each sacrificial semiconductor material nanosheet 18 suspends a portion of each semiconductor channel material nanosheet 20 of the nanosheet stack. Gate structure 48 is then formed on the suspended portion of each semiconductor channel material nanosheet 20. At this point of the present processing flow, the gate structure 48 contacts four physically exposed surfaces of each semiconductor channel material nanosheet 20 as shown in FIG. 8B and thus nanosheet transistors are formed (the nanosheet transistors will be converted into fork sheet transistors during the formation of the backside dielectric pillar of the present application). The gate structure 48 includes a gate dielectric material and a gate electrode, both of which are not separately shown, but intended to be within the region defined by the gate structure 48. As is known to those skilled in the art, a gate dielectric material directly contacts a physically exposed surface(s) of the semiconductor channel region, and a gate electrode is formed on the gate dielectric material. The gate dielectric material has a dielectric constant of 4.0 or greater. Illustrative examples of gate dielectric materials include, but are not limited to, silicon dioxide, hafnium dioxide ($HfO_2$), hafnium silicon oxide (HfSiO), hafnium silicon oxynitride (HfSiO), lanthanum oxide ($La_2O_3$), lanthanum aluminum oxide ($LaAlO_3$), zirconium dioxide ($ZrO_2$), zirconium silicon oxide ($ZrSiO_4$), zirconium silicon oxynitride ($ZrSiO_xN_y$), tantalum oxide ($TaO_x$), titanium oxide (TiO), barium strontium titanium oxide ($BaO_6SrTi_2$), barium titanium oxide ($BaTiO_3$), strontium titanium oxide ($SrTiO_3$), yttrium oxide ($Yb_2O_3$), aluminum oxide ($Al_2O_3$), lead scandium tantalum oxide ($Pb(Sc,Ta)O_3$), and/or lead zinc niobite (Pb(Zn,Nb)O). The gate dielectric material can further include dopants such as lanthanum (La), aluminum (Al) and/or magnesium (Mg). The gate electrode can include a work function metal (WFM) and optionally a conductive metal. The WFM can be used to set a threshold voltage of the transistor to a desired value. In some embodiments, the WFM can be selected to effectuate an n-type threshold voltage shift. "N-type threshold voltage shift" as used herein means a shift in the effective work-function of the work-function metal-containing material towards a conduction band of silicon in a silicon-containing material. In one embodiment, the work function of the n-type work function metal ranges from 4.1 eV to 4.3 eV. Examples of such materials that can effectuate an n-type threshold voltage shift include, but are not limited to, titanium aluminum, titanium aluminum carbide, tantalum nitride, titanium nitride, hafnium nitride, hafnium silicon, or combinations thereof. In other embodiments, the WFM can be selected to effectuate a p-type threshold voltage shift. In one embodiment, the work function of the p-type work function metal ranges from 4.9 eV to 5.2 eV. As used herein, "threshold voltage" is the lowest attainable gate voltage that will turn on a semiconductor device, e.g., transistor, by making the channel of the device conductive. The term "p-type threshold voltage shift" as used herein means a shift in the effective work-function of the work-function metal-containing material towards a valence band of silicon in the silicon containing material. Examples of such materials that can effectuate a p-type threshold voltage shift include, but are not limited to, titanium nitride, and tantalum carbide, hafnium carbide, and combinations thereof. The optional conductive metal can include, but is not limited to aluminum (Al), tungsten (W), or cobalt (Co). The gate structure 48 can be formed by deposition, followed by a planarization process.

After forming the gate structure 48, MOL level is formed. The MOL level formation includes forming a second frontside ILD layer (not specifically labeled in FIGS. 8A-8C). Collectively, the first frontside ILD layer and the second frontside ILD layer provide a multi-layered MOL region 50. The second dielectric layer can be composed of compositionally same, or compositionally different, ILD material than the frontside ILD layer. When the first frontside ILD layer and the second frontside ILD layer are composed of a compositionally same ILD material, no material interface is present between the two ILD layers (such an embodiment in illustrated in FIGS. 8A-8C). When the first frontside ILD layer and the second frontside ILD layer are composed of compositionally different ILD materials, a material interface (not shown) is present between the two ILD layers. The second frontside ILD layer can be formed by a deposition process, followed by a planarization process. The MOL level formation continues by forming various frontside contact structures including frontside source/drain contact structures 52A, 52B, and frontside gate contact structures 53. In the present application, frontside source/drain contact structure 52A contacts one of the first device source/drain regions 44, while frontside source/drain contact structure 52B contacts one of the second device source/drain regions 46. Frontside gate contact structures 53 contact a gate electrode of the gate structure 48. Each of the frontside contact structures is composed of at least a contact conductor material. The contact conductor material can include, for example, a silicide liner, such as Ni, Pt, NiPt, an adhesion metal liner, such as TiN, and conductive metals such as W, Cu, Al, Co, Ru, Mo, Os, Ir, Rh, or an alloy thereof. Each of frontside contact structures can also include one or more contact liners (not shown). In one or more embodiments, the contact liner (not shown) can include a diffusion barrier material. Exemplary diffusion barrier materials include, but are not limited to, Ti, Ta, Ni, Co, Pt, W, Ru, TiN, TaN, WN, WC, an alloy thereof, or a stack thereof such as Ti/TiN and Ti/WC. In one or more embodiments in which a contact liner is present, the contact liner (not shown) can include a silicide liner, such as Ti, Ni, NiPt, etc., and a diffusion barrier material, as defined above. Each of the frontside contact structures can be formed by a metallization process which includes forming (by lithography and etching) frontside contact openings in at least some of the ILD layers that provide the MOL multi-layered region 50, and then filling each frontside contact opening with at least a contact conductor material as defined above. The filling of each frontside contact opening can include a deposition process (such as, for example, CVD, PECVD, atomic layer deposition (ALD) or sputtering), followed by a planarization process.

The frontside BEOL structure 54 is formed on top of the MOL level. The frontside BEOL structure 54 is composed of an interconnect dielectric region having frontside metal wiring embedded therein. The interconnect dielectric region includes one or more interconnect dielectric material layers. The interconnect dielectric material layers can be composed of at least one of the ILD materials mentioned above. The frontside metal wiring can be in the form of metal lines, metal vias, a metal via/metal line combination or any combinations thereof. The frontside metal wiring is composed of an electrically conductive metal or an electrically conductive metal alloy. Illustrative examples of electrically conductive metals that can be used include, but are not limited to, Cu, Al, Co, Ru, Mo, Os, Ir, or Rh. An illustrative electrically conductive alloy that can be used includes, but is not limited to, a Cu—Al alloy. The frontside BEOL structure 54 can be formed utilizing any well-known BEOL process including a damascene process or a subtractive metal etch process. It is noted that the frontside BEOL structure 54 is electrically connected to each of the transistors through the frontside contact structures described above.

After forming the frontside BEOL structure 54, carrier wafer 56 is formed on the frontside BEOL structure 54. Carrier wafer 56 can include a semiconductor material as defined above. Carrier wafer 56 is bonded to the frontside BEOL structure 54 utilizing any bonding process that is well known to those skilled in the art. This concludes the frontside processing of the exemplary structure, backside processing will now be performed.

Figure 9B:
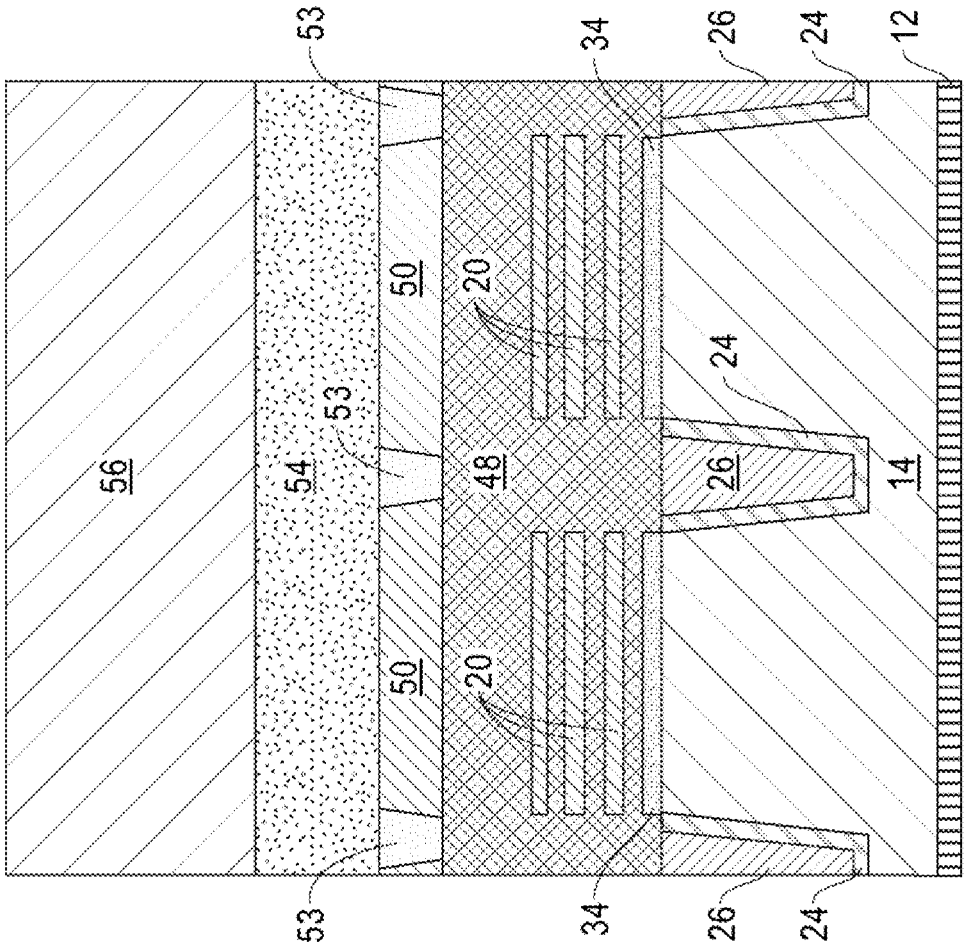
FIGS. 9A-9C are cross sectional views of the exemplary structure of FIGS. 8A-8C, respectively, after wafer flipping and removing a semiconductor base layer of the substrate to reveal an etch stop layer of the substrate.
Figure 9A:
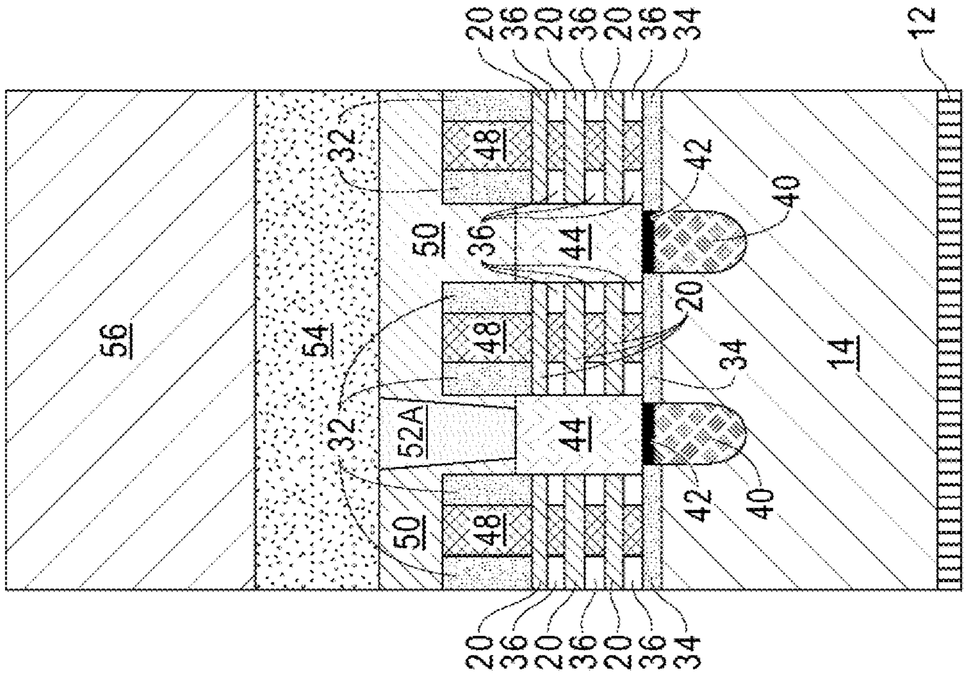
Figure 9C:
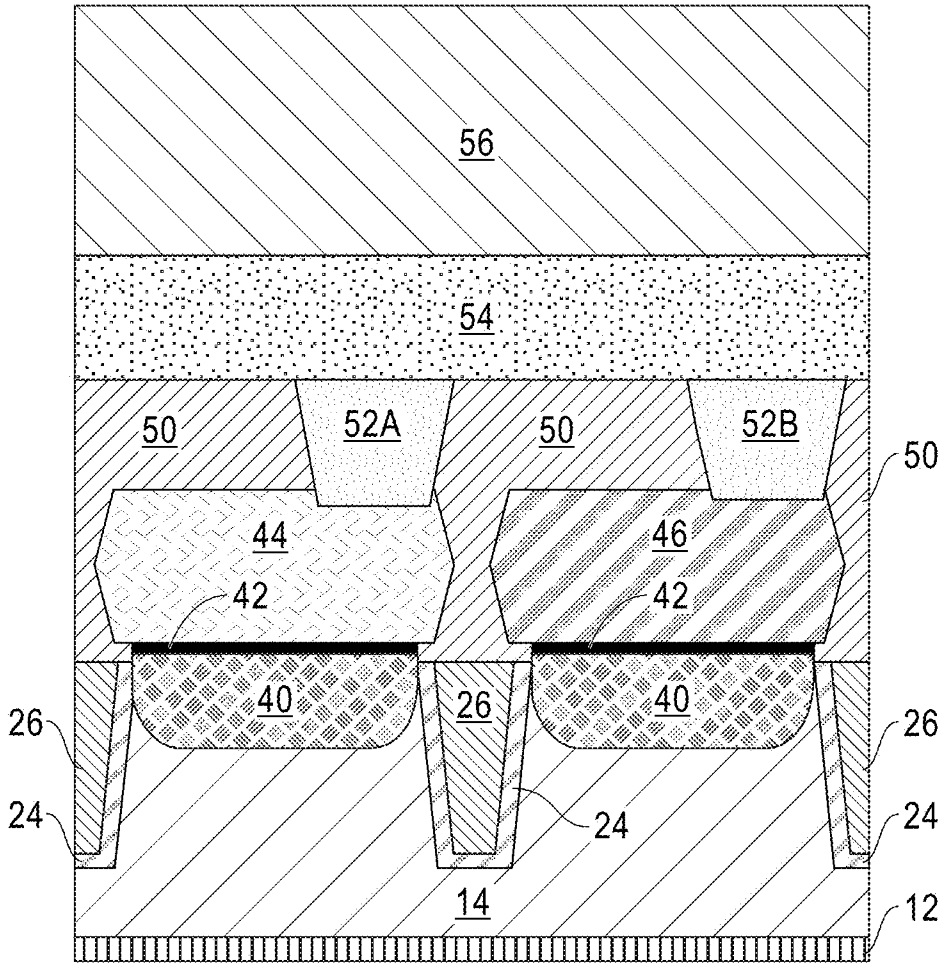

Referring now to FIGS. 9A-9C, there are illustrated the exemplary structure of FIGS. 8A-8C, respectively, after wafer flipping and removing semiconductor base layer 10 of the substrate to reveal etch stop layer 12 of the substrate. In the present application, backside processing begins by flipping the exemplary structure 180° to physically expose a backside of the structure. For clarity, the flipping step is not shown in the drawings. Flipping can be performed by hand or by utilizing a mechanical means such as, for example, a robot arm. After flipping, and in the illustrated embodiment, the semiconductor base layer 10 is physically exposed and the physically exposed semiconductor base layer 10 is removed utilizing a material removal process that is selective in removing the semiconductor material that provides the semiconductor base layer 10. The removal of the semiconductor base layer 10 reveals the etch stop layer 12. The removal of the semiconductor base layer 10 can be omitted when no semiconductor base layer 10 is present in the substrate.

Figure 10A:
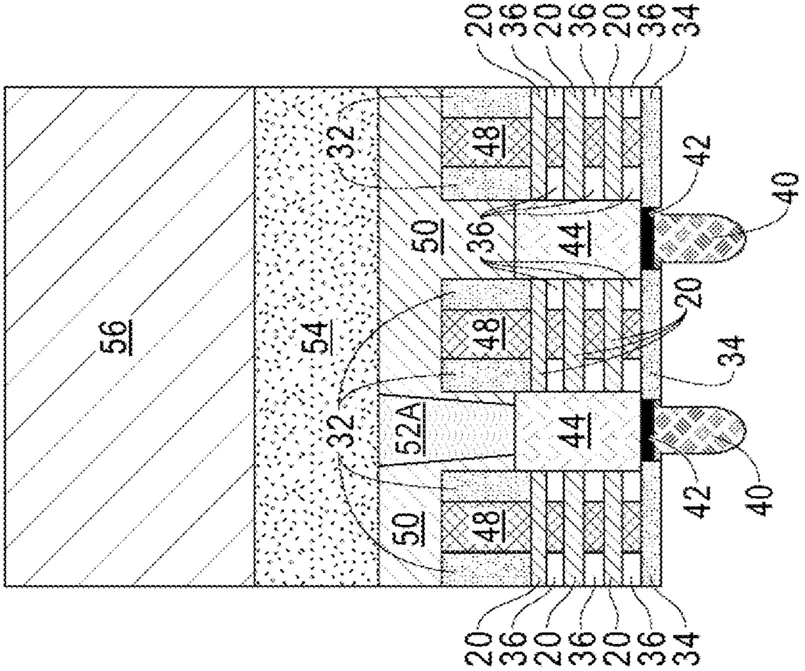
FIGS. 10A-10C are cross sectional views of the exemplary structure of FIGS. 9A-9C, respectively, after removing the etch stop layer and a semiconductor device layer of the substrate.
Figure 10B:
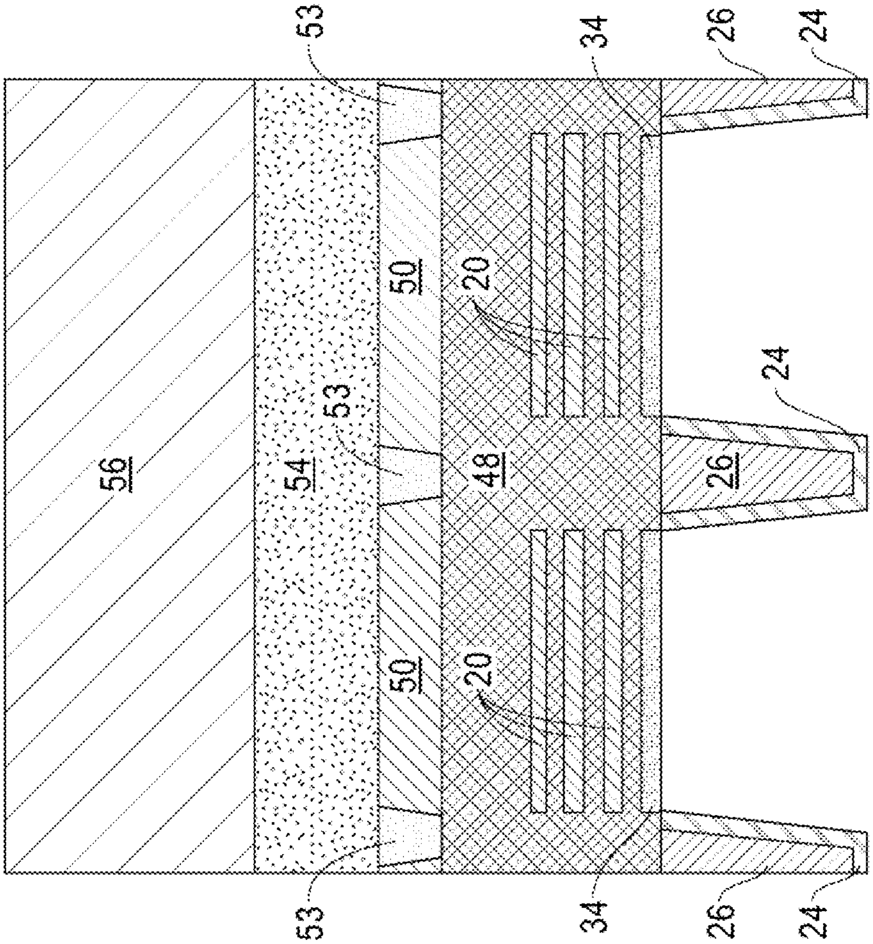
Figure 10C:
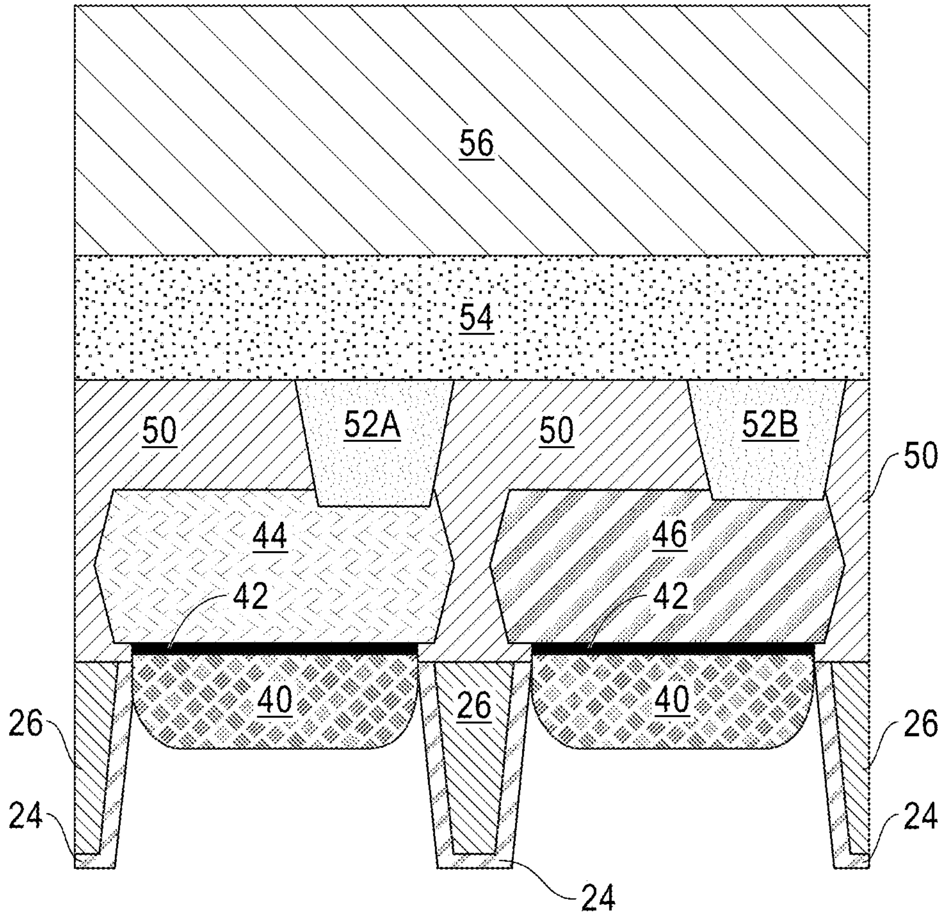

Referring now to FIGS. 10A-10C, there are illustrated the exemplary structure of FIGS. 9A-9C, respectively, after removing the etch stop layer 12 and semiconductor device layer 14 of the substrate. The etch stop layer 12 can then be removed utilizing a material removal process that is selective in removing the material that provides the etch stop layer 12. The removal of the etch stop layer 12 physically exposes the semiconductor device layer 14. It is noted that the removal of the etch stop layer 12 can be omitted when such a layer is not present. The semiconductor device layer 14 can be removed utilizing a material removal process that is selective in removing the semiconductor device layer 14. The removal of the semiconductor device layer 14 physically exposes the bottom dielectric isolation layer 34, the shallow trench isolation structure and the backside source/drain contact placeholder structures 40.

Figure 11B:
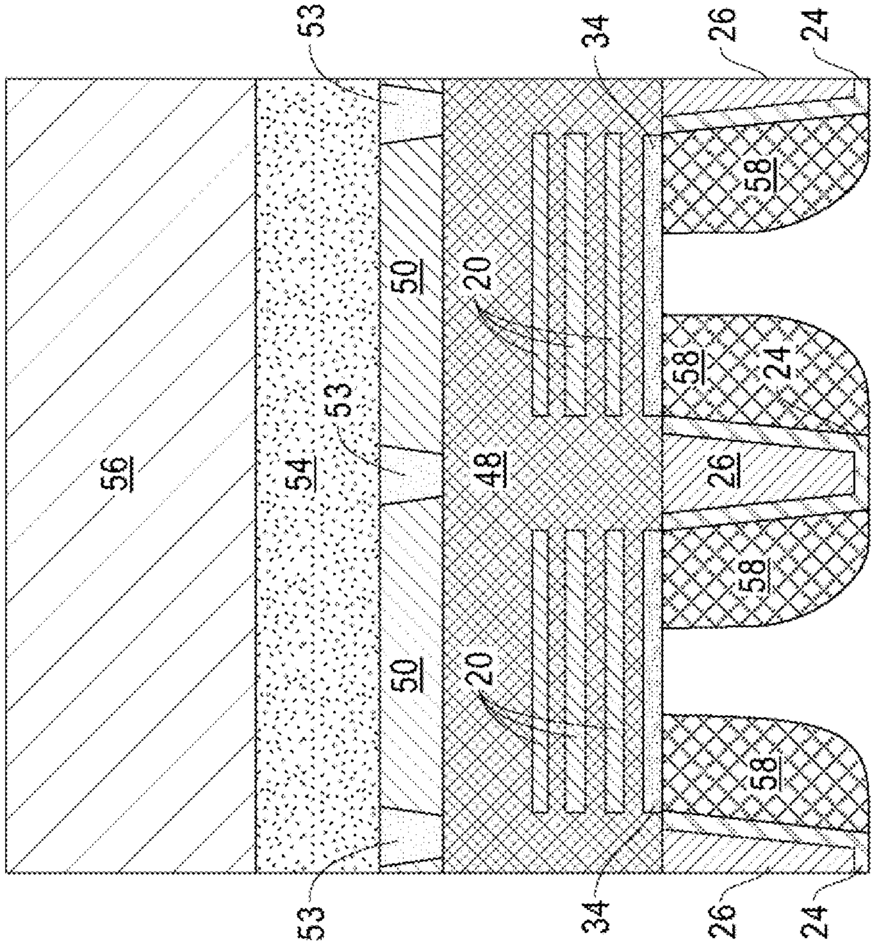
FIGS. 11A-11C are cross sectional views of the exemplary structure of FIGS. 10A-10C, respectively, after forming a backside dielectric spacer.
Figure 11A:
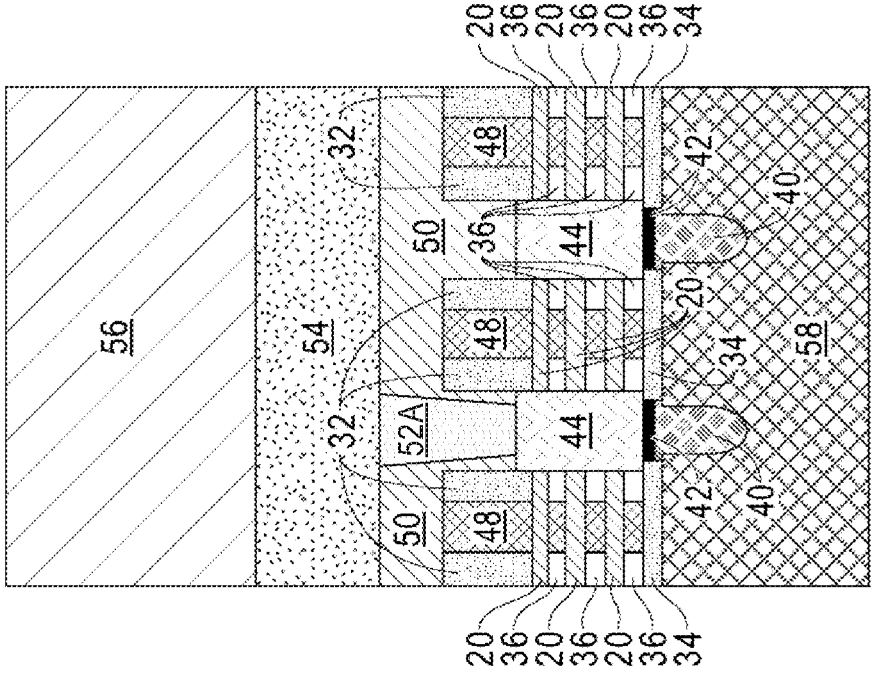
Figure 11C:
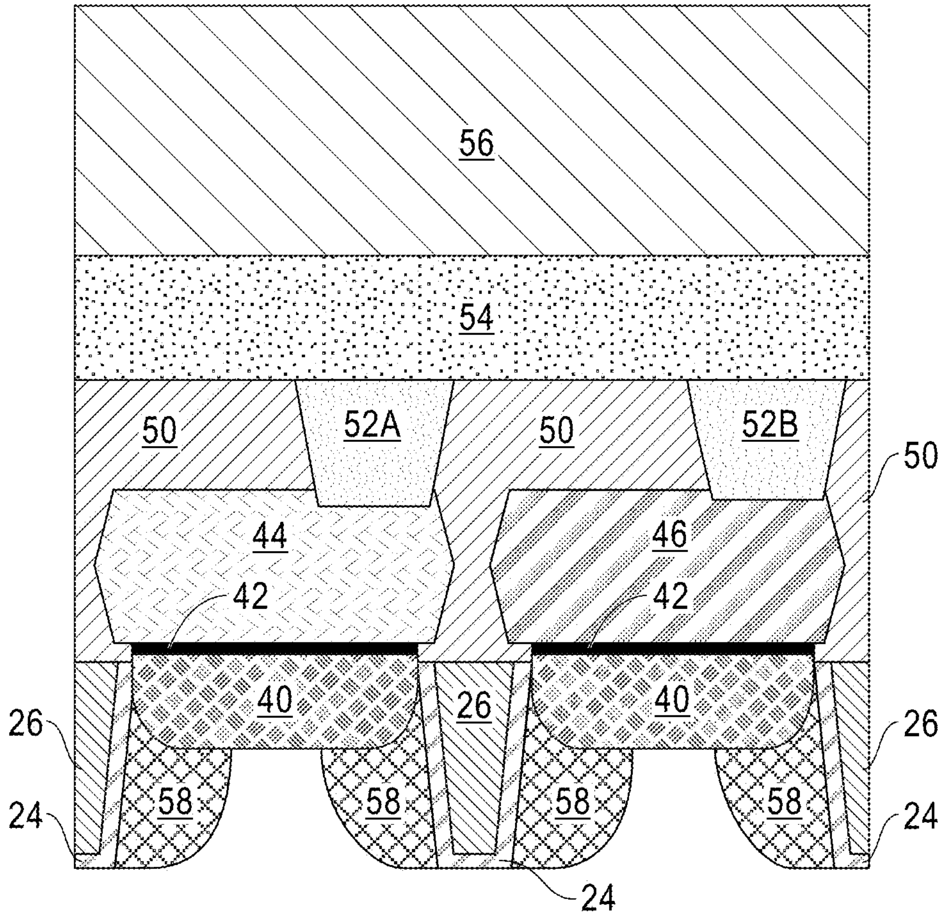

Referring now to FIGS. 11A-11C, there are illustrated the exemplary structure of FIGS. 10A-10C, respectively, after forming a backside dielectric spacer 58. The backside dielectric spacer 58 is composed of a dielectric material including a ILD material as defined above or a dielectric spacer material as defined above. In some embodiments, low k dielectric materials (i.e., dielectrics have a dielectric constant of less than 4.0) are preferred materials for backside dielectric spacer 58 since such dielectrics could provide a capacitance reduction to the device. The backside dielectric spacer 58 can be formed by deposition, followed by a spacer etch. The backside dielectric spacer 58 having openings as shown in FIGS. 11B and 11C which will be used in defining the area in which backside dielectric pillars will be subsequently formed.

Figure 12B:
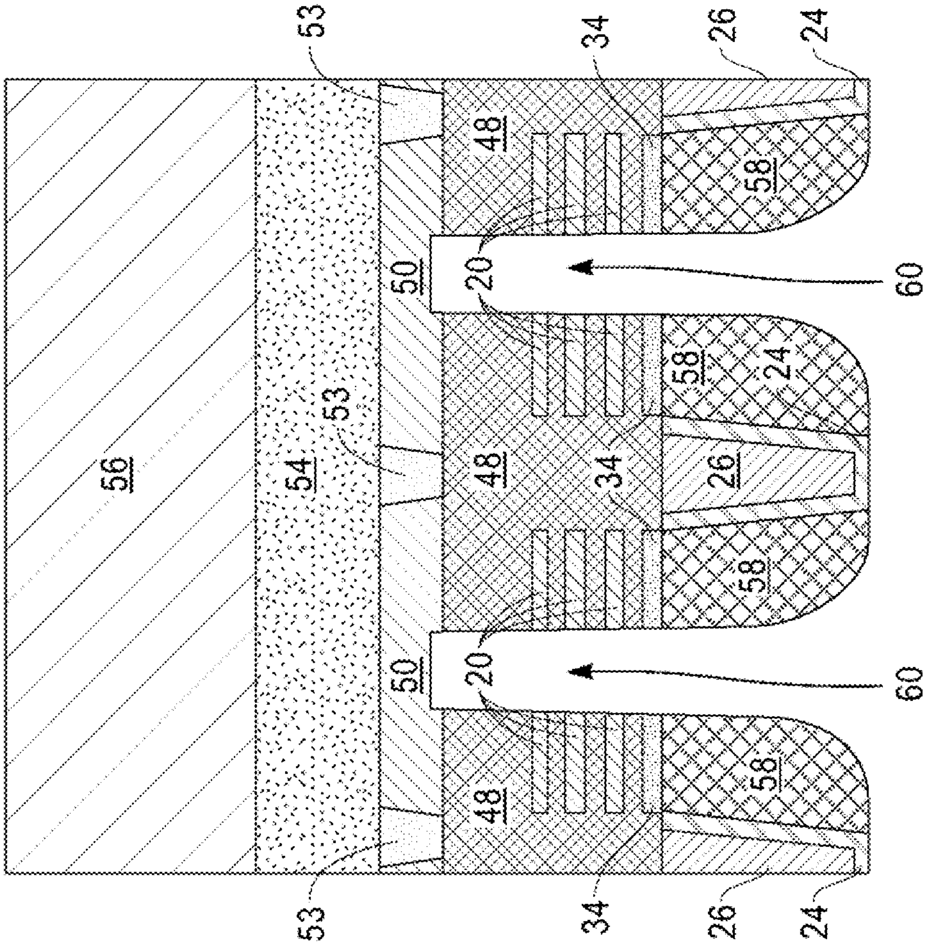
FIGS. 12A-12C are cross sectional views of the exemplary structure of FIGS. 11A-11C, respectively, after performing a self-aligned backside fork sheet cut.
Figure 12A:
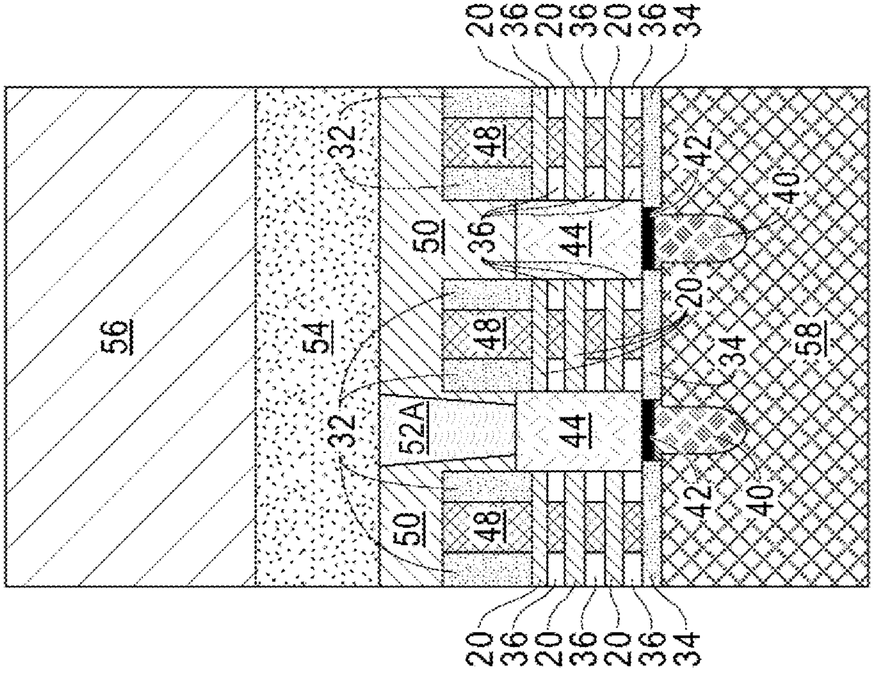
Figure 12C:
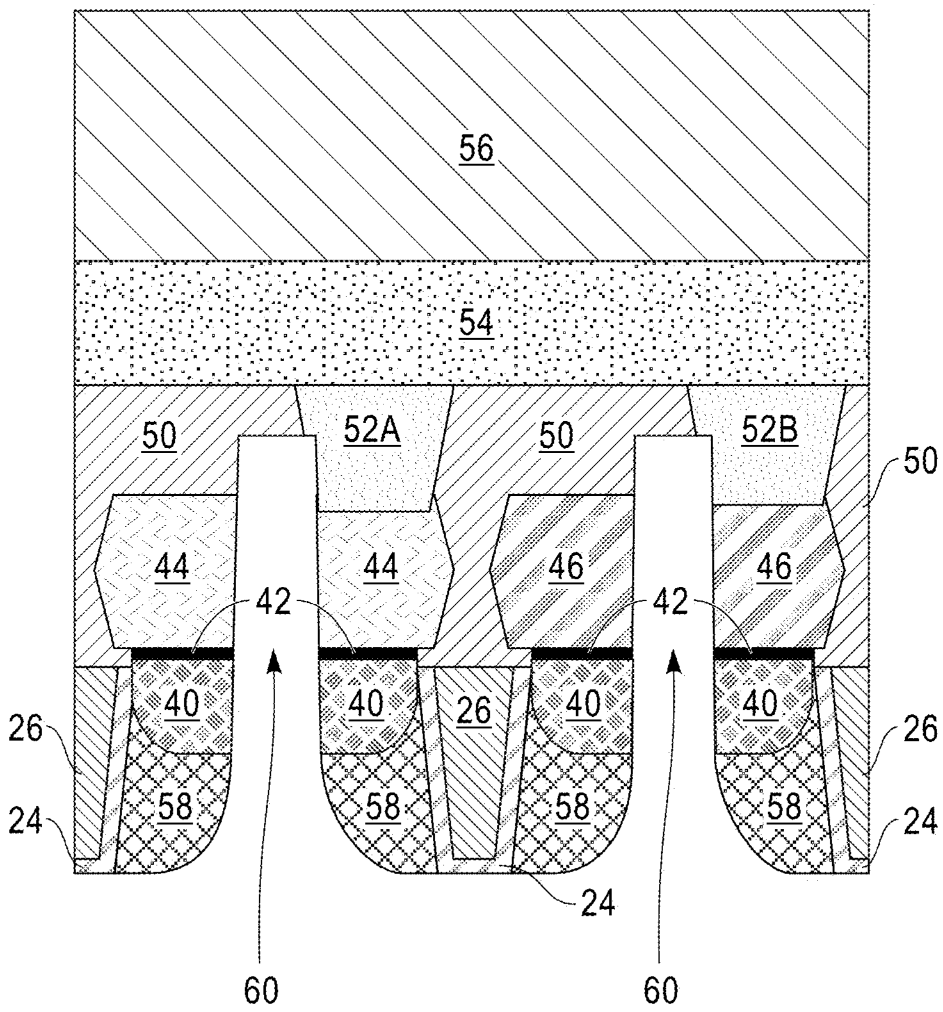

Referring now to FIGS. 12A-12C, there are illustrated the exemplary structure of FIGS. 11A-11C, respectively, after performing a self-aligned backside fork sheet cut utilizing the backside dielectric spacer 58 as a self-aligned etch mask. The self-aligned backside fork sheet cut includes an etching process such as, for example, RIE. In the gate cross sectional view shown in FIG. 12B, the etching process removes physically exposed portions of the bottom dielectric isolation layer 34, gate structure 48 and semiconductor channel material nanosheets 20; the etching process stops in the multi-layered MOL dielectric region 50. In the source/drain cross sectional view shown in FIG. 12C, backside dielectric pillar openings 60 is formed that extends through the backside source/drain contact placeholder structures 40, the optional semiconductor buffer layer 42, the source/drain regions (e.g., the first device source/drain regions 44 and the second device source/drain regions 46); the etching process stops in the multi-layered MOL dielectric region 50. Note that in the source/drain cross sectional view, the etching process can remove a sidewall portion of each of the frontside source/drain contact structures 52A, 52B. The self-aligned backside fork sheet cut employed in the present application forms backside dielectric pillar openings 60 in the structure which extend from the backside of the structure to the frontside of the structure. Note that no separate mask or lithography step is needed in forming the backside dielectric pillar openings 60.

In the locations including the backside dielectric pillar openings 60, the gate structure 48 and the semiconductor channel material nanosheets 20 are cut such that a fork sheet transistor is located on each side of the backside dielectric pillar openings 60.

Figure 13B:
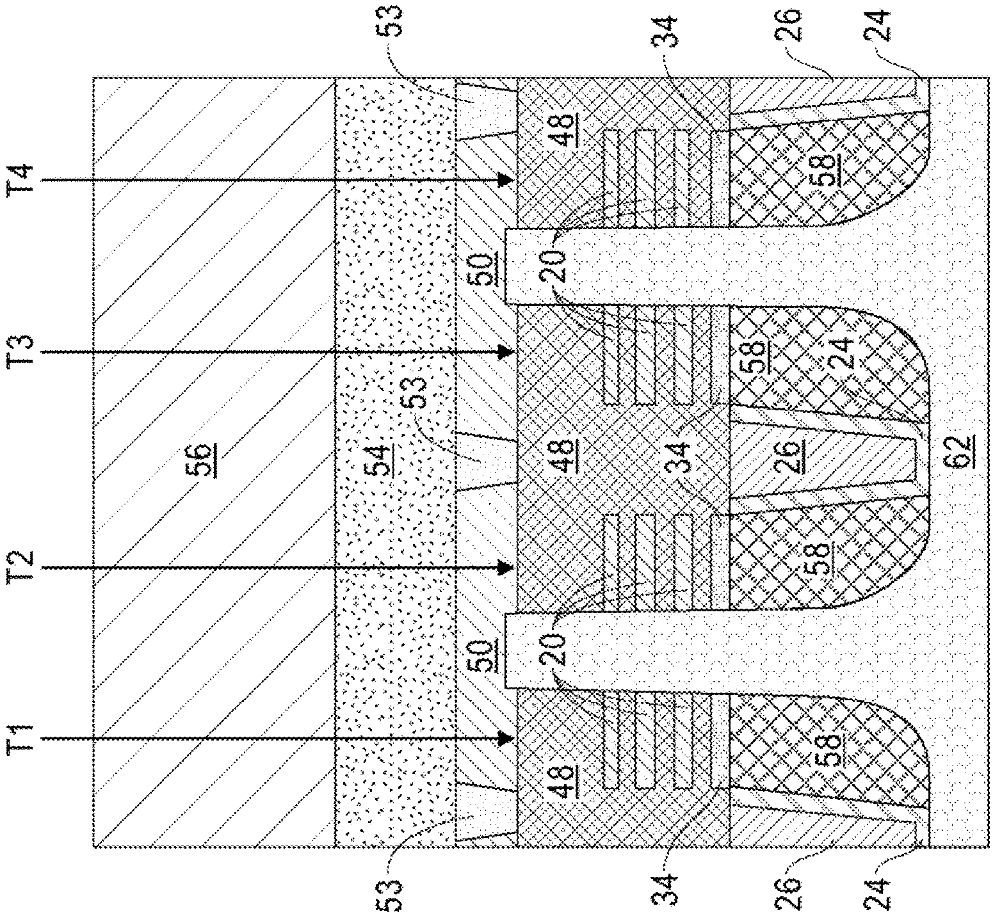
FIGS. 13A-13C are cross sectional views of the exemplary structure of FIGS. 12A-12C, respectively, after dielectric fill and planarization to provide a backside dielectric pillar.
Figure 13A:
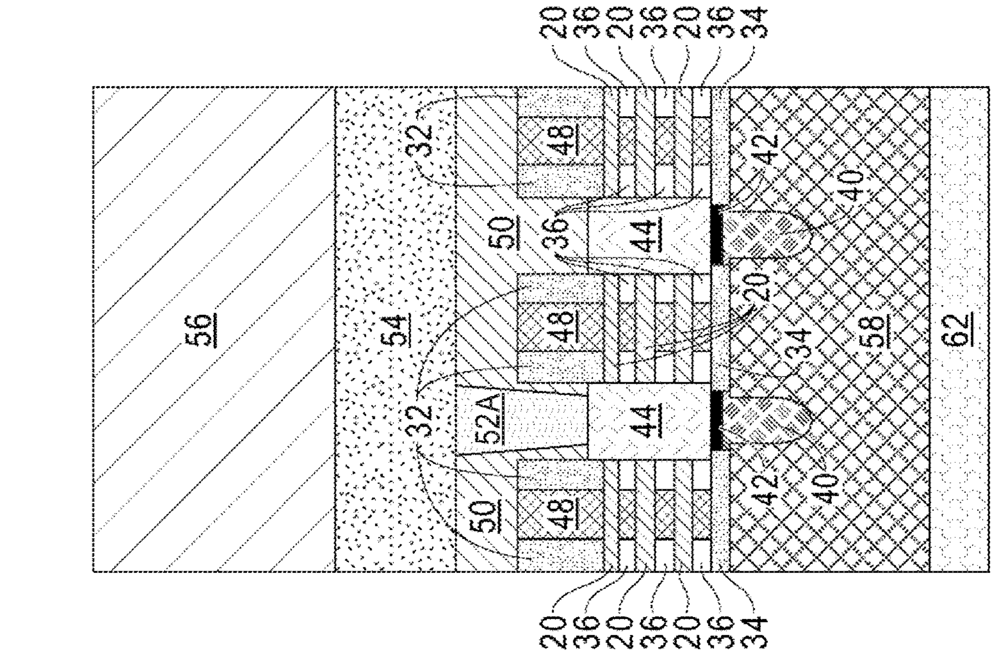
Figure 13C:
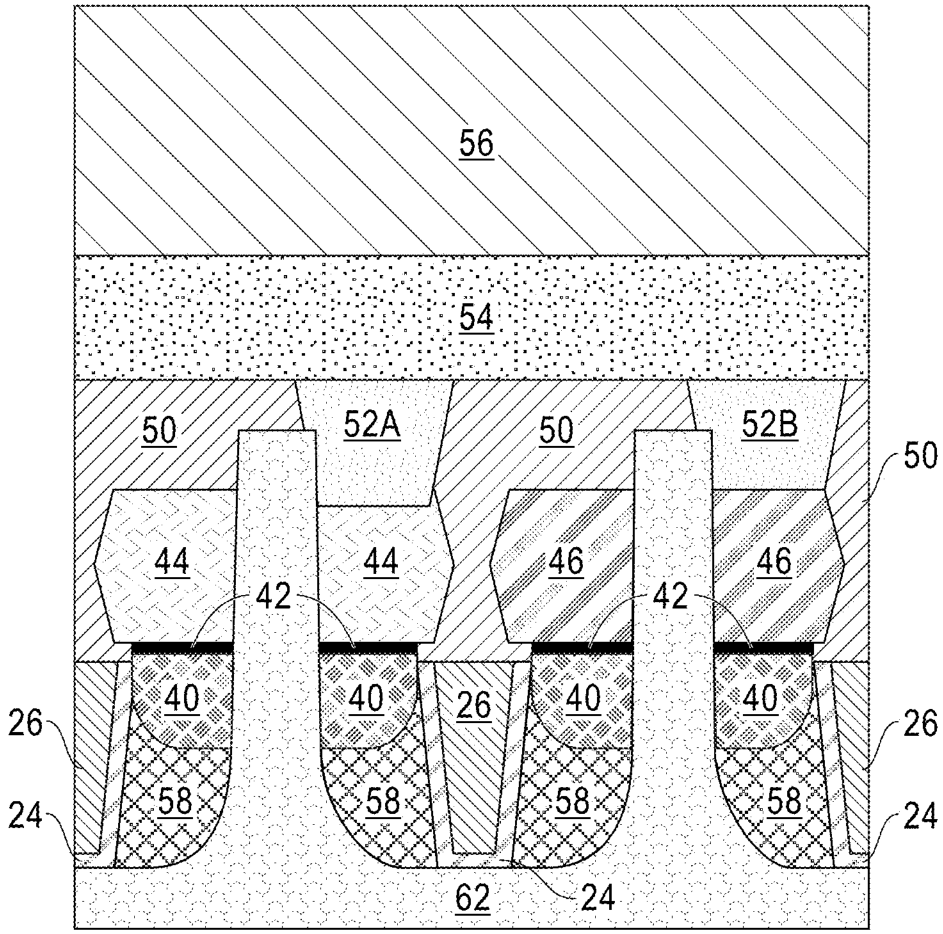

Referring now to FIGS. 13A-13C, there are illustrated the exemplary structure of FIGS. 12A-12C, respectively, after dielectric fill and planarization to provide a backside dielectric pillar 62. The backside dielectric pillar 62 is self-aligned since no separate lithography step is needed to form the same. The backside dielectric pillar 62 of the present application includes base portion that is present entirely on the backside of the structure, and a vertical extending portion that extends from the base portion into the frontside of the structure as is shown in FIGS. 13A-13C. The backside dielectric pillar 62 is formed in backside dielectric pillar openings 60 and on a surface of the backside dielectric spacer 58. In the gate structure cross sectional view shown in FIG. 13B, the backside dielectric pillar 62 contacts a sidewall edge of each of the semiconductor channel material nanosheets 20 that were previously subjected to the self-aligned backside fork sheet cut mentioned above. In the source/drain cross sectional view illustrated in FIG. 13C, the backside dielectric pillar 62 contacts a sidewall of the cut source/drain regions (e.g., the cut first device source/drain regions 44 and the cut second device source/drain regions 46). The dielectric fill includes deposition of a dielectric pillar material. The dielectric pillar material can include silicon dioxide, SiC, SiN, SiBCN, SiOCN or SiOC.

The backside dielectric pillar 62 on the left hand side of FIG. 13B provides electrically isolation between first fork sheet transistor T1 and second fork sheet transistor T2, and the backside dielectric pillar 62 on the right hand side of FIG. 13B provides electrically isolation between third fork sheet transistor T3 and fourth fork sheet transistor T4. In the present application, T2 and T3 share a common gate structure. In one embodiment, T1 and T2 are NFETs, while T3 and T4 are PFETs. T1 and T2 form a first pair of fork sheet transistors, while T3 and T4 form a second pair of fork sheet transistors. In the present application, the backside dielectric pillar 62 extends above a topmost surface of the gate structure 48 and is present in a portion of the multi-layered MOL dielectric region 50. The backside dielectric pillar also contacts a sidewall of the frontside source/drain contact structure 52A.

Figure 14B:
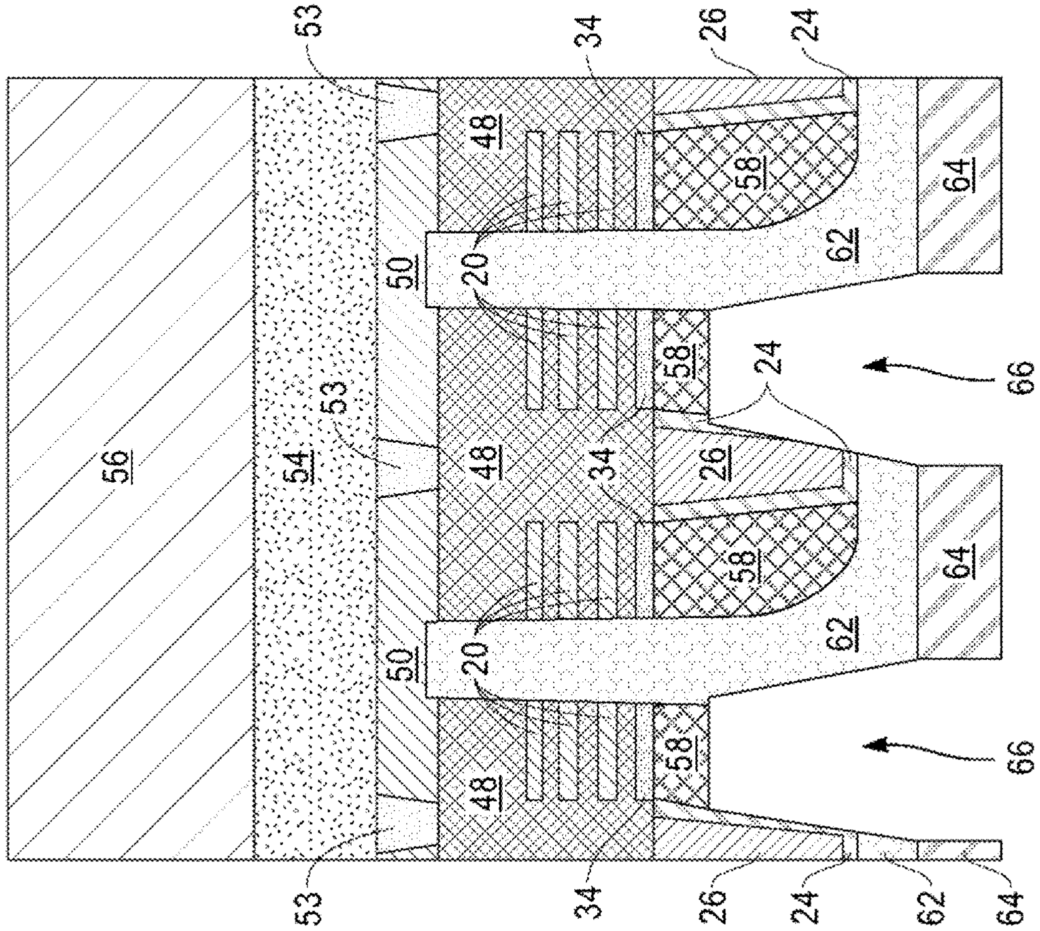
FIGS. 14A-14C are cross sectional views of the exemplary structure of FIGS. 13A-13C, respectively, after forming backside source/drain contact openings that reveal some of the backside source/drain contact placeholder structures.
Figure 14A:
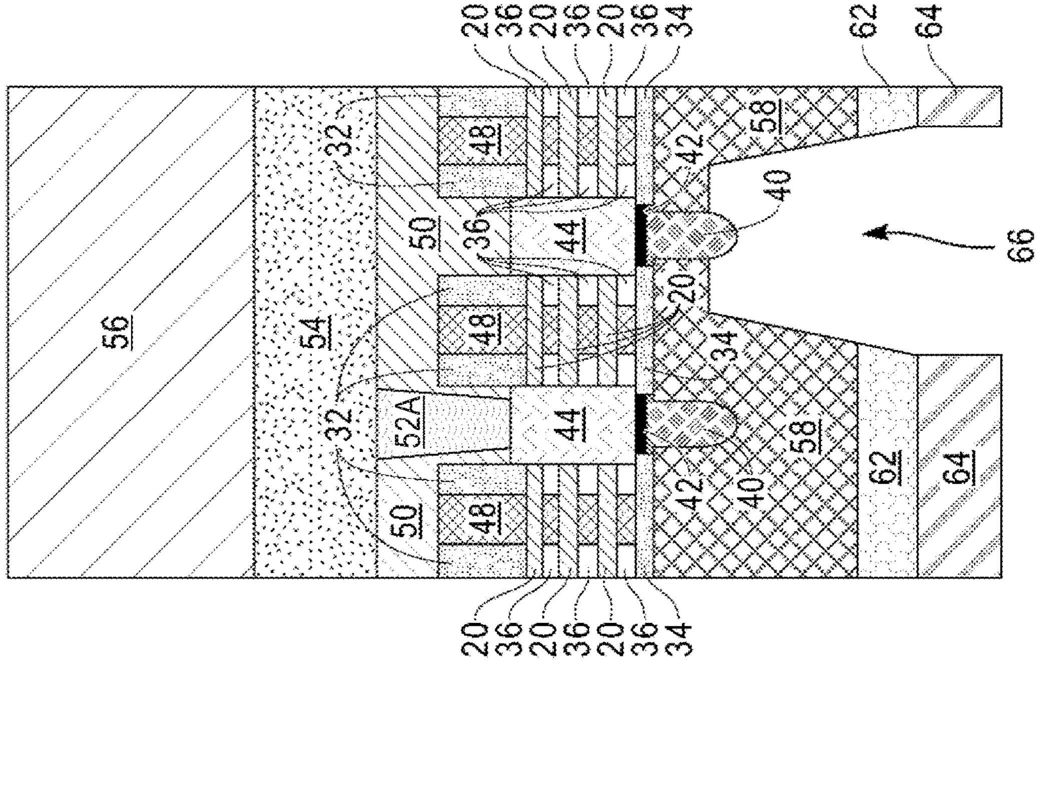
Figure 14C:
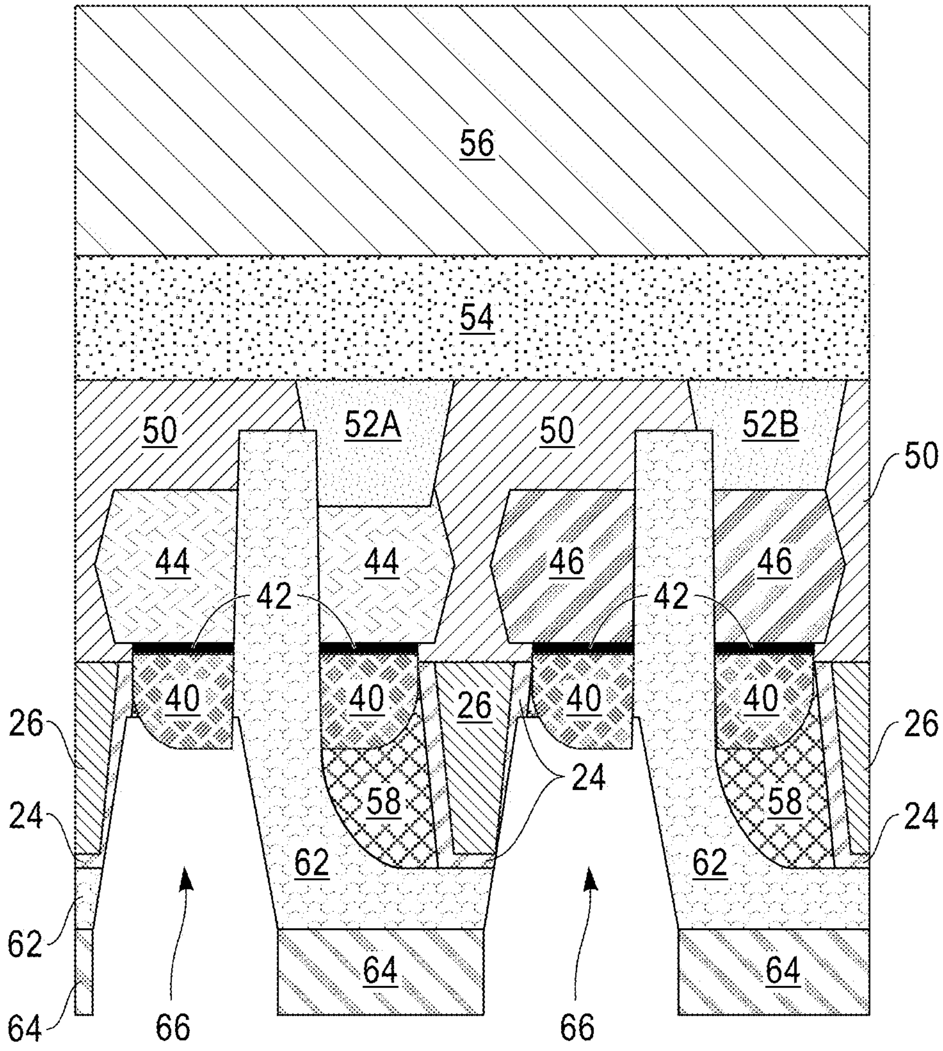

Referring now to FIGS. 14A-14C, there are illustrated the exemplary structure of FIGS. 13A-13C, respectively, after forming backside source/drain contact openings 66 that reveal some of the backside source/drain contact placeholder structures 40. The formation of the backside source/drain contact openings 66 begins by forming a patterned masking layer 64 on a horizontal surface of the backside dielectric pillar 62. The patterned masking layer 64 is composed of a masking material or a combination of masking materials that are well known to those skilled in the art. In one example, the masking material that provides the patterned masking layer 64 is an organic planarization material. The patterned masking layer 64 can be formed by deposition of the masking material(s), followed by lithographic patterning. After forming the patterned masking layer 64, the backside source/drain contact openings 66 formation continues by etching (e.g., RIE) through the backside dielectric pillar 62 and the backside dielectric spacer 58 to physically expose some of the backside source/drain contact placeholder structures 40. After the formation of the backside source/drain contact openings 66, the patterned masking layer 64 can be removed from the structure utilizing a material removal process such as, for example, ashing, which is selective in removing the patterned masking layer 64.

Figure 15B:
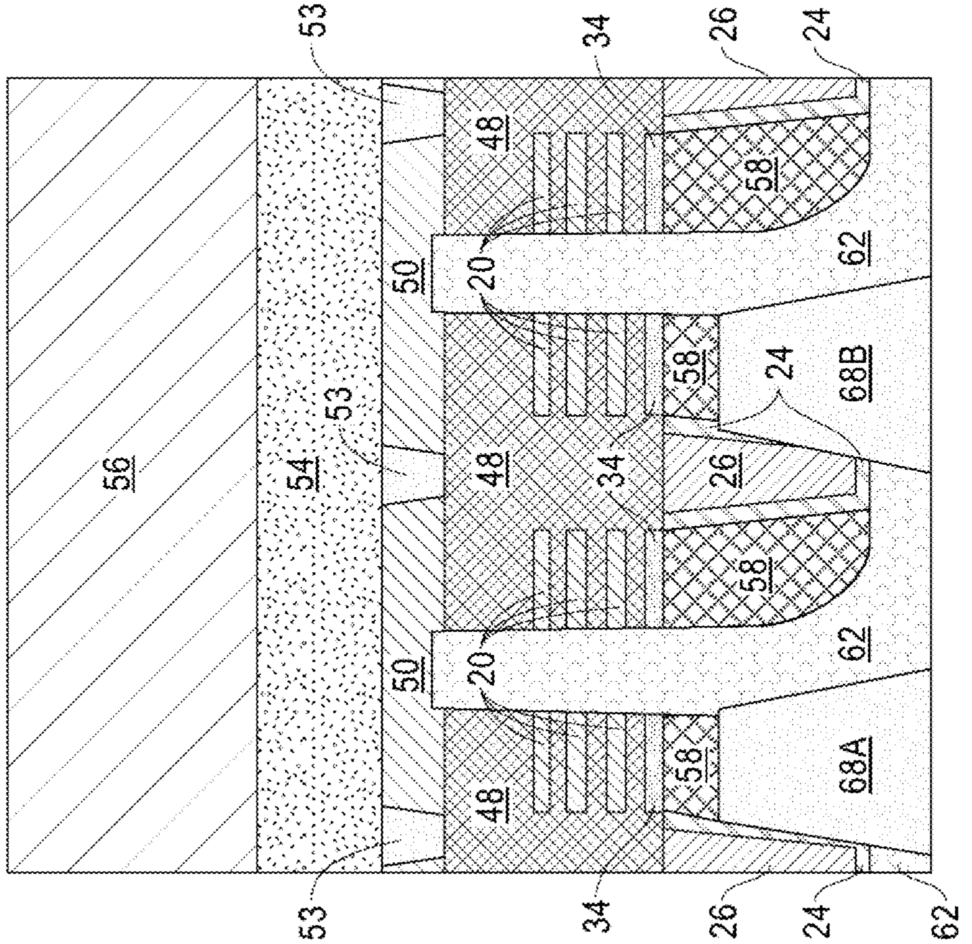
FIGS. 15A-15C are cross sectional views of the exemplary structure of FIGS. 14A-14C, respectively, after removing the revealed backside source/drain contact placeholder structures and forming backside source/drain contact structures.
Figure 15A:
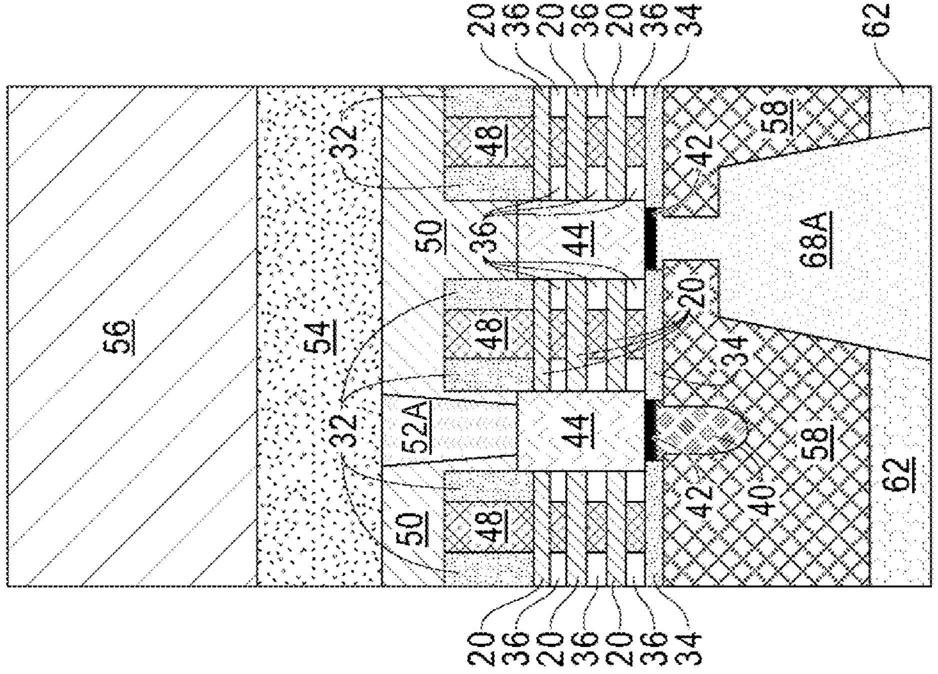
Figure 15C:
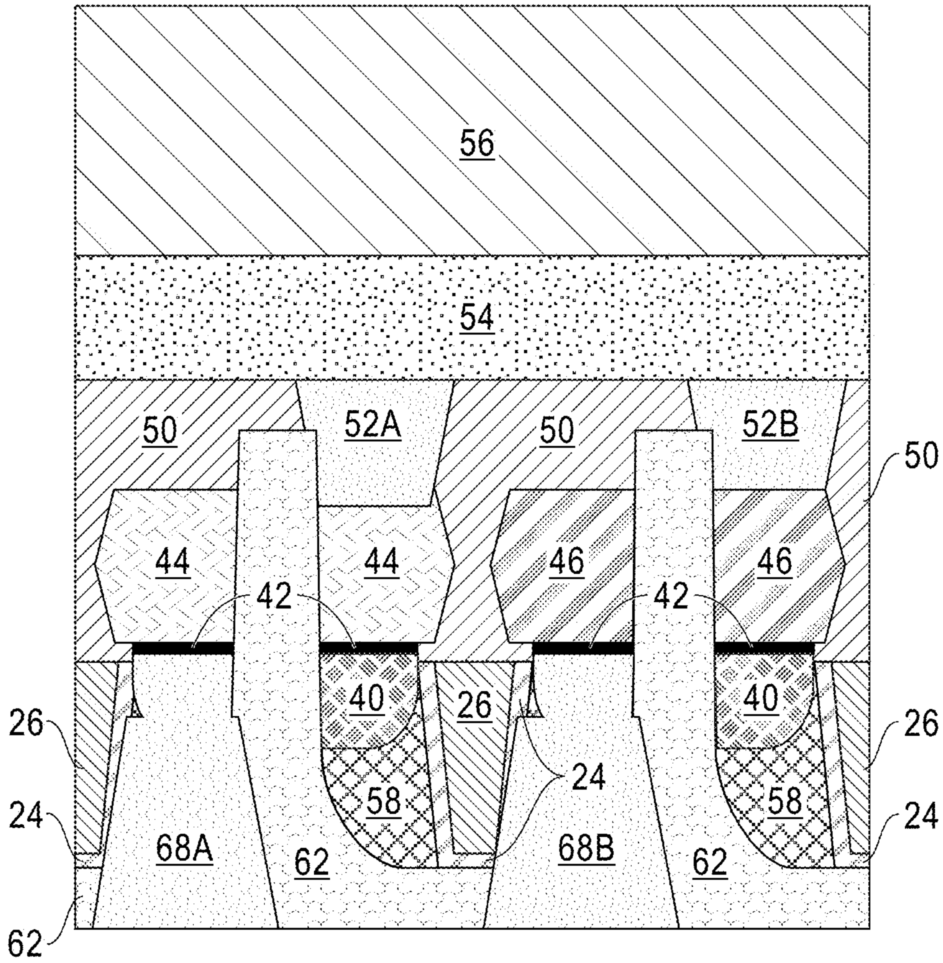

Referring now to FIGS. 15A-15C, there are illustrated the exemplary structure of FIGS. 14A-14C, respectively, after removing the revealed backside source/drain contact placeholder structures 40 and forming backside source/drain contact structures 68A, 68B. The revealed backside source/drain contact placeholder structures 40 can be removed utilizing a material removal process such as, for example, an etch, that is selective in removing the revealed backside source/drain contact placeholder structures 40. In some embodiments (and as is illustrated in FIGS. 15A-15C), the material removal process stops on a surface of the semiconductor buffer layer 42. In other embodiments and when the semiconductor buffer layer 42 is not present, the material removal process stops on a surface of the source/drain region of one of the fork sheet transistors (i.e., one of the first device source/drain regions 44 and/or one of the second device source/drain regions 46). Such an embodiment is not illustrated in the drawings, but can be readily discerned from FIGS. 15A-15C. In some embodiments in which the semiconductor buffer layer 42 is present, a punch through etching process can be performed to physically expose a surface of the source/drain region of one of the fork sheet transistors (i.e., one of the first device source/drain regions 44 and/or one of the second device source/drain regions 46).

The backside source/drain contact structures 68A, 68B can be composed of at least a contact conductor material as mentioned above for the frontside contact structures. The backside source/drain contact structures 68A, 68B can also include one of the liners mentioned above with respect to the frontside contact structures. The backside source/drain contact structures 68A, 68B can be formed by deposition, followed by a planarization process. In the present application, the backside source/drain contact structure 68A contacts another of the first device source/drain regions 44, while the backside source/drain contact structure 68B contacts another of the second device source/drain regions 44. The backside source/drain contact structures 68A, 68B have a first surface contacting a source/drain region of a fork sheet transistor and a second surface, opposite the first surface, that direct contacts the backside BEOL structure 70. Similarly, the frontside source/drain contact structures 52A, 52B have a first surface contacting a source/drain region of fork sheet transistor and a second surface, opposite the first, that directly contacts the frontside BEOL structure 54. The backside source/drain contact structures 68A, 68B are embedded at least in part in the backside dielectric pillar 62 (the backside dielectric pillar 62 is embedded in part in the backside dielectric spacer 58).

Figure 16B:
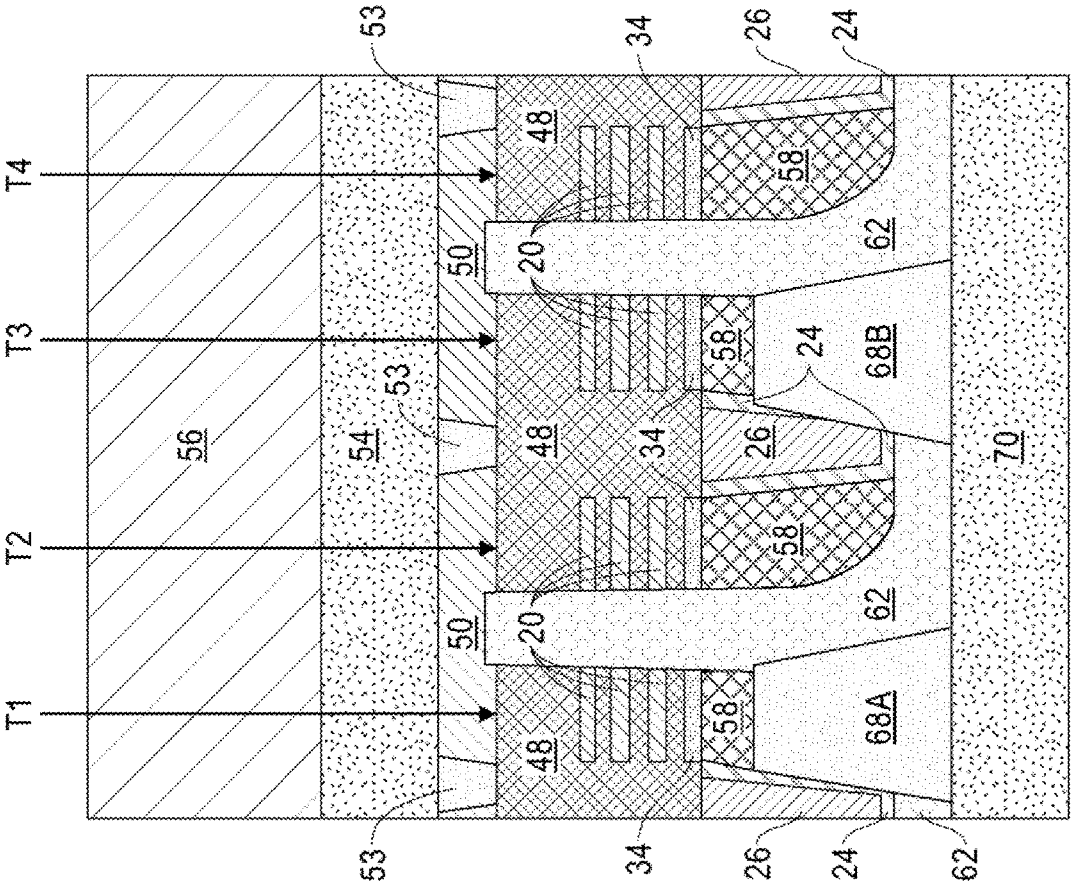
FIGS. 16A-16C are cross sectional views of the exemplary structure of FIGS. 15A-15C, respectively, after forming a backside BEOL structure.
Figure 16A:
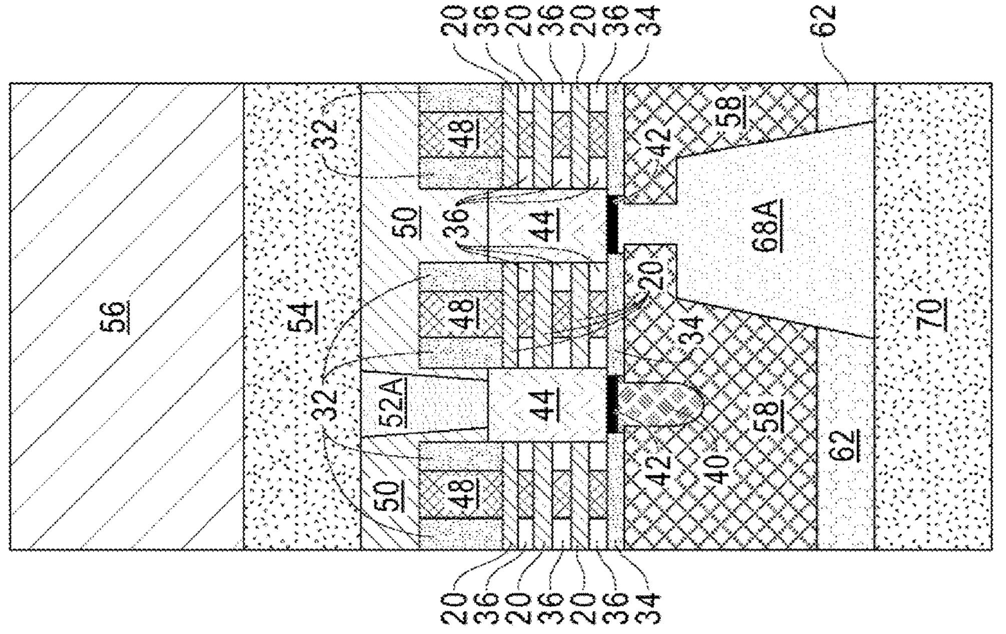
Figure 16C:
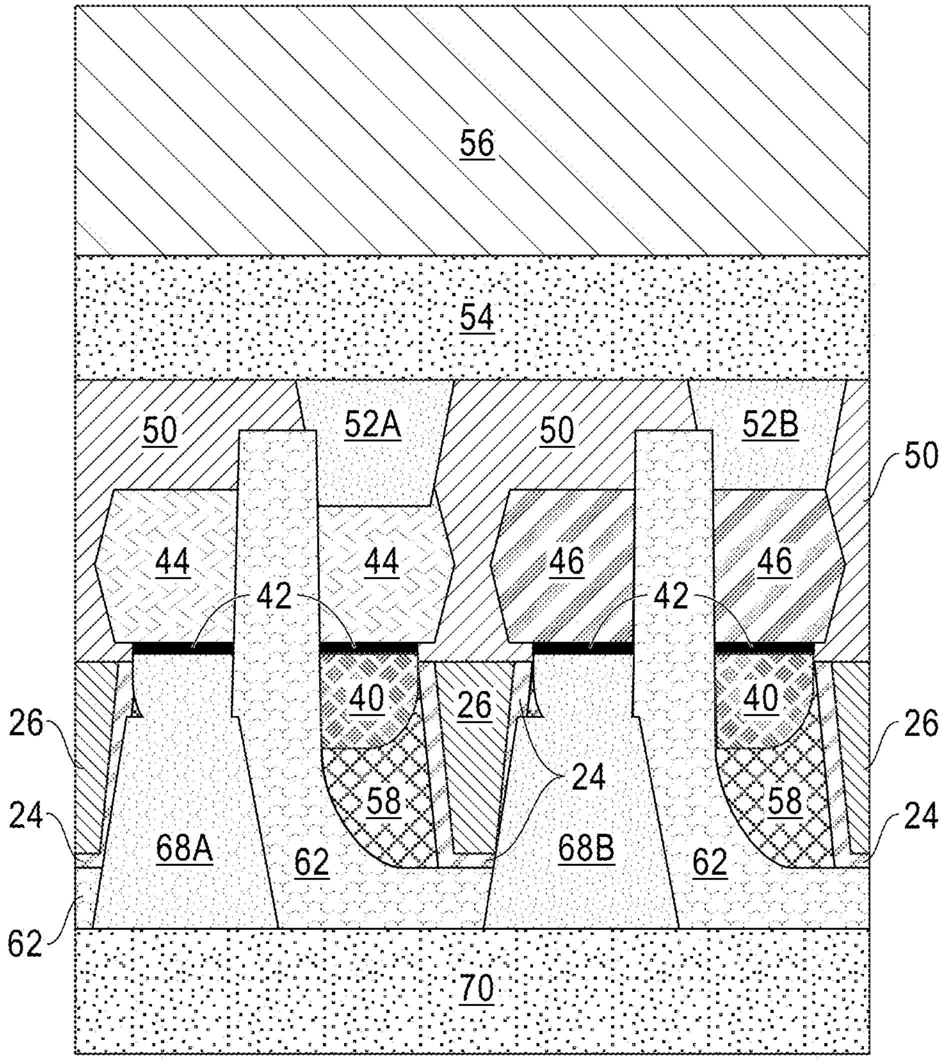

Referring now to FIGS. 16A-16C, there are illustrated the exemplary structure of FIGS. 15A-15C, respectively, after forming a backside BEOL structure 70. The backside BEOL structure 70 is formed on a surface of the backside dielectric pillar 62. The backside BEOL structure 70 (which can delivery power from the backside of the device) is composed of an interconnect dielectric region having backside metal wiring embedded therein. The interconnect dielectric region includes one or more interconnect dielectric material layers. The interconnect dielectric material layers can be composed of one of the ILD materials mentioned above. The backside metal wiring which can be in the form of metal lines, metal vias, a metal via/metal line combination or any combinations thereof is composed of an electrically conductive metal or an electrically conductive metal alloy, as both defined above. The backside BEOL structure 70 can be formed utilizing any well-known BEOL process including a damascene process or a subtractive metal etch process. It is noted that the backside BEOL structure 70 is electrically connected to each of the transistors through the backside source/drain contact structures 68A, 68B.

Notably, FIGS. 16A-16C illustrate an exemplary semiconductor device in accordance with the present application. The exemplary semiconductor device illustrated in FIGS. 16A-16C includes a pair of fork sheet transistors of a same conductivity type (e.g., T1 and T2 or T3 and T4) located on opposite sidewalls of backside dielectric pillar 62. The backside dielectric pillar 62 entirely separates the pair of fork sheet transistors from each other. The exemplary device further includes backside BEOL structure 70 directly contacting a bottommost surface of backside dielectric pillar 62 and electrically connected to a source drain region (e.g., one of the first device source/drain regions 44 and/or one of the second device source/drain regions 46) of a first fork sheet transistor (e.g., T1 or T3) of the pair of fork sheet transistors, and frontside BEOL structure 54 electrically connected to a source/drain region (e.g., one of the first device source/drain regions 44 and/or one of the second device source/drain regions 46) of a second fork sheet transistor (e.g., T2 or T4) of the pair of fork sheet transistors.

FIGS. 16A-16B also illustrates a semiconductor device that includes a first pair of fork sheet transistors of a first conductivity type (i.e., T1 and T2) located on opposite sidewalls of a first backside dielectric pillar (i.e., dielectric pillar 32 on the left hand side of FIGS. 14B and 14C), where the first backside dielectric pillar entirely separates the first pair of fork sheet transistors from each other, and a second pair of fork sheet transistors of a second conductivity type (i.e., T3 and T4) opposite the first conductivity type located on opposite sidewalls of a second first backside dielectric pillar (i.e., dielectric pillar 32 on the right hand side of FIGS. 14B and 14C), and adjacent to the first pair of transistors, where the second backside dielectric pillar entirely separates the second pair of fork sheet transistors from each other. The semiconductor device further includes backside BEOL structure 70 directly contacting a bottommost surface of the first backside dielectric pillar and electrically connected to a source/drain region (i.e., first device source/drain region 44) of a first fork sheet transistor (i.e., T1) of the first pair of fork sheet transistors, and directly contacting a bottommost surface of the second backside dielectric pillar and electrically connected to a source/drain region (i.e., second device source/drain region 46)) of a third fork sheet transistor (i.e., T3) of the second pair of fork sheet transistors, and frontside BEOL structure 54 electrically connected to a source/drain region (i.e., first device source/drain region 44) of a second fork sheet transistor (i.e., T2) of the first pair of fork sheet transistors and electrically connected to a source/drain region (i.e., second device source/drain region 46) of a fourth fork sheet transistor (i.e., T4) of the second pair of transistors.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor device comprising:

a pair of fork sheet transistors of a same conductivity type located on opposite sidewalls of a backside dielectric pillar, wherein the backside dielectric pillar entirely separates the pair of fork sheet transistors from each other;

a backside back-end-of-the-line (BEOL) structure directly contacting a bottommost surface of the backside dielectric pillar and electrically connected to a source/drain region of a first fork sheet transistor of the pair of fork sheet transistors; and a frontside BEOL structure electrically connected to a source/drain region of a second fork sheet transistor of the pair of fork sheet transistors.

2. The semiconductor device of claim 1, further comprising a backside source/drain contact structure embedded at least in the backside dielectric pillar, wherein the backside source/drain contact structure has a first surface directly contacting the source/drain region of the first fork sheet transistor and a second surface, opposite the first surface, directly contacting the backside BEOL structure.

3. The semiconductor device of claim 1, further comprising a backside source/drain contact structure embedded at least in the backside dielectric pillar, wherein the backside source/drain contact structure has a first surface directly contacting a semiconductor buffer layer located beneath the source/drain region of the first fork sheet transistor and a second surface, opposite the first surface, directly contacting the backside BEOL structure.

4. The semiconductor device of claim 1, wherein the backside dielectric pillar is embedded at least in a backside dielectric spacer.

5. The semiconductor device of claim 1, wherein the backside dielectric pillar extends above a topmost surface of a gate structure of both the first fork sheet transistor and the second fork sheet transistor.

6. The semiconductor device of claim 1, further comprising a frontside source/drain contact structure embedded in a multi-layered middle-of-the-line (MOL) dielectric region, wherein the frontside source/drain contact structure has a first surface directly contacting the source/drain region of the second fork sheet transistor and a second surface, opposite the first surface, directly contacting the frontside BEOL structure.

7. The semiconductor device of claim 6, wherein the backside dielectric pillar extends into a portion of the multi-layered MOL dielectric region and contacts a sidewall of the frontside source/drain contact structure.

8. The semiconductor device of claim 1, wherein each of first fork sheet transistor and the second fork sheet transistor of the pair of fork sheet transistors comprises a plurality of semiconductor channel material nanosheets and a gate structure, wherein each semiconductor channel material nanosheet of the plurality of semiconductor channel material nanosheets has a surface in direct physically contact with the backside dielectric pillar.

9. The semiconductor device of claim 1, further comprising a bottom dielectric isolation layer located beneath the first fork sheet transistor and the second fork sheet transistor of the pair of fork sheet transistors.

10. A semiconductor device comprising:

a first pair of fork sheet transistors of a first conductivity type located on opposite sidewalls of a first backside dielectric pillar, wherein the first backside dielectric pillar entirely separates the first pair of fork sheet transistors from each other;

a second pair of fork sheet transistors of a second conductivity type opposite the first conductivity type located on opposite sidewalls of a second first backside dielectric pillar and located adjacent to the first pair of transistors, wherein the second backside dielectric pillar entirely separates the second pair of fork sheet transistors from each other;

a backside back-end-of-the-line (BEOL) structure directly contacting a bottommost surface of the first backside dielectric pillar and electrically connected to a source/drain region of a first fork sheet transistor of the first pair of fork sheet transistors, and directly contacting a bottommost surface of the second backside dielectric pillar and electrically connected to a source/drain region of a third fork sheet transistor of the second pair of fork sheet transistors; and a frontside BEOL structure electrically connected to a source/drain region of a second fork sheet transistor of the first pair of fork sheet transistors and electrically connected to a source/drain region of a fourth fork sheet transistor of the second pair of transistors.

11. The semiconductor device of claim 10, further comprising a first backside source/drain contact structure and a second backside source/drain contact structure embedded at least in the backside dielectric pillar, wherein the first backside source/drain contact structure has a first surface directly contacting the source/drain region of the first fork sheet transistor and a second surface, opposite the first surface, directly contacting the backside BEOL structure, and the second backside source/drain contact structure has a first surface directly contacting the source/drain region of the third fork sheet transistor and a second surface, opposite the first surface, directly contacting the backside BEOL structure.

12. The semiconductor device of claim 10, further comprising a first backside source/drain contact structure and a second backside source/drain contact structure embedded at least in the backside dielectric pillar, wherein the first backside source/drain contact structure has a first surface directly contacting a semiconductor buffer layer located beneath the source/drain region of the first fork sheet transistor and a second surface, opposite the first surface, directly contacting the backside BEOL structure, and wherein the second backside source/drain contact structure has a first surface directly contacting another semiconductor buffer layer located beneath the source/drain region of the third fork sheet transistor and a second surface, opposite the first surface, directly contacting the backside BEOL structure.

13. The semiconductor device of claim 10, wherein the first backside dielectric pillar and the second backside dielectric pillar are both embedded at least in a backside dielectric spacer.

14. The semiconductor device of claim 10, wherein the first backside dielectric pillar extends above a topmost surface of a gate structure of both the first fork sheet transistor and the second fork sheet transistor, and the second backside dielectric pillar extends above a topmost surface of a gate structure of the third fork sheet transistor and the fourth fork sheet transistor.

15. The semiconductor device of claim 10, wherein the second fork sheet transistor shares a common gate structure with the third fork sheet transistor.

16. The semiconductor device of claim 10, further comprising a first frontside source/drain contact structure and a second frontside source/drain contact structure embedded in a multi-layered middle-of-the-line (MOL) dielectric region, wherein the first frontside source/drain contact structure has a first surface directly contacting the source/drain region of the second fork sheet transistor and a second surface, opposite the first surface, directly contacting the frontside BEOL structure, and the second frontside source/drain contact structure has a first surface directly contacting the source/drain region of the fourth fork sheet transistor and a second surface, opposite the first surface, directly contacting the frontside BEOL structure.

17. The semiconductor device of claim 16, wherein the first backside dielectric pillar and the second backside dielectric pillar both extend into a portion of the multi-layered MOL dielectric region, and the first backside dielectric pillar contacts a sidewall of the first frontside source/drain contact structure, and the second backside dielectric pillar contacts a sidewall of the second frontside source/drain contact structure.

18. The semiconductor device of claim 10, wherein each of first fork sheet transistor and the second fork sheet transistor of the first pair of fork sheet transistor comprises a plurality of semiconductor channel material nanosheets and a gate structure, wherein each semiconductor channel material nanosheet of the plurality of semiconductor channel material nanosheets has a surface in direct physically contact with the first backside dielectric pillar.

19. The semiconductor device of claim 10, wherein each of third fork sheet transistor and the fourth fork sheet transistor of the second pair of fork sheet transistors comprises a plurality of semiconductor channel material nanosheets and a gate structure, wherein each semiconductor channel material nanosheet of the plurality of semiconductor channel material nanosheets has a surface in direct physically contact with the second backside dielectric pillar.

20. The semiconductor device of claim 10, further comprising a bottom dielectric isolation layer located beneath the first fork sheet transistor, the second fork sheet transistor, the third fork sheet transistor and the fourth fork sheet transistor.

* * * * *